United States Patent [19]
Shimano et al.

[11] Patent Number: 5,715,226
[45] Date of Patent: Feb. 3, 1998

[54] FLYING TYPE OPTICAL HEAD INTEGRALLY FORMED WITH LIGHT SOURCE AND PHOTODETECTOR AND OPTICAL DISK APPARATUS WITH THE SAME

[75] Inventors: Takeshi Shimano; Kenchi Ito, both of Hachioji; Yooji Maruyama, Iruma; Hiroyuki Awano, Nagareyama, all of Japan

[73] Assignee: Hitachi, Ltd., Tokyo, Japan

[21] Appl. No.: 460,196

[22] Filed: Jun. 2, 1995

Related U.S. Application Data

[62] Division of Ser. No. 197,870, Feb. 17, 1994, Pat. No. 5,481,386.

[30] Foreign Application Priority Data

Feb. 17, 1993 [JP] Japan ................... 5-027799
Feb. 24, 1993 [JP] Japan ................... 5-033845

[51] Int. Cl.⁶ .......................................... G11B 7/00
[52] U.S. Cl. ................... 369/112; 369/122; 369/44.14
[58] Field of Search ...................... 369/122, 44.14, 369/44.12, 44.15, 44.11, 44.17, 44.21, 44.22, 112, 110, 13, 36, 108

[56] References Cited

U.S. PATENT DOCUMENTS

| | | |
|---|---|---|
| 3,833,769 | 9/1974 | Compaan et al. ............ 369/108 X |
| 4,460,989 | 7/1984 | Russell ......................... 369/108 X |
| 5,255,260 | 10/1993 | Yamada et al. ............... 369/36 X |
| 5,295,122 | 3/1994 | Murakami et al. ........... 369/44.15 X |

*Primary Examiner*—Muhammad N. Edun
*Attorney, Agent, or Firm*—Antonelli, Terry, Stout, & Kraus, LLP

[57] ABSTRACT

The optical head is arranged such that a semiconductor laser and a photodetector are formed via a buffer layer on the same substrate; and an opening portion is formed in the substrate under the semiconductor laser and the photodetector. This optical head is further arranged by that the opening portion is filled with a first transparent layer; a diffraction grating is formed on a lower surface of the first transparent layer; a second transparent layer is stacked on a lower surface of the first transparent layer; and a condenser lens is formed on a lower surface of the transparent layer. In this optical head, laser light emitted from the semiconductor laser is penetrated through the substrate, the first transparent layer, the diffraction grating, and the second transparent layer, and condensed toward a place just under the condenser lens by the condenser lens, thereby forming a light spot on an optical storage medium positioned apart from the condenser lens, whereas reflection light reflected from the optical storage medium is penetrated through the condenser lens and the second transparent layer, diffracted by the diffraction grating toward a light receiving plane of the photodetector, and further penetrated through the first transparent layer to be received by the photodetector.

17 Claims, 16 Drawing Sheets

OUT FOCUS    JUST FOCUS    IN FOCUS

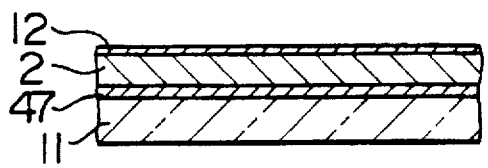
FIG. 5A
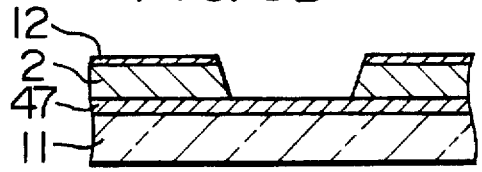
FIG. 5B
FIG. 5C
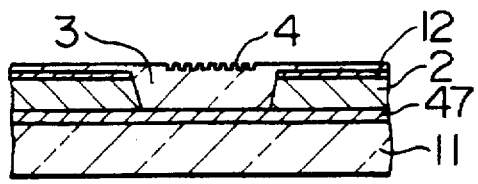
FIG. 5D
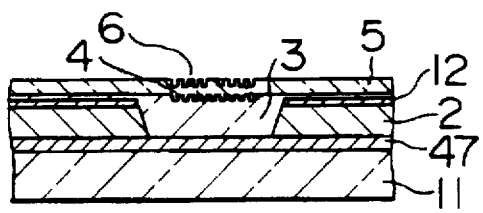
FIG. 5E
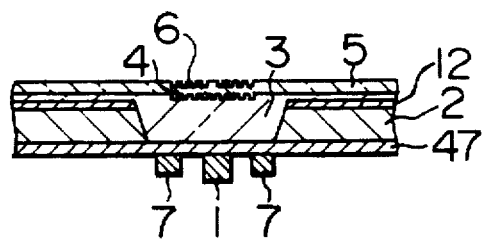
FIG. 5F

FLYING TYPE OPTICAL HEAD INTEGRALLY FORMED WITH LIGHT SOURCE AND PHOTODETECTOR AND OPTICAL DISK APPARATUS WITH THE SAME

This application is a Division of application Ser. No. 08/197,870, filed Feb. 17, 1994, now U.S. Pat. No. 5,481,386.

BACKGROUND OF THE INVENTION

The present invention relates to an optical head, a method for manufacturing an optical head, and an optical disk apparatus.

Conventionally, the optical heads (namely, optical pick up) are known in the art, for instance, from JP-A-64-46242 and JP-A-64-43822.

The optical head described in JP-A-64-46242 is so constructed that the surface emitting laser and the photodetector are formed on the same substrate, the glass plates are stacked, or laminated on this substrate, and the focusing grating coupler (hologram lens) is fabricated on the surface of this glass plate.

On the other hand, the optical head described in JP-A-64-43822 is so arranged that the above-described optical head disclosed in JP-A-64-46242 is employed as the optical head main body, and this optical head main body is mounted on the flying slider.

In the optical head disclosed in JP-A-64-46242, the focusing grating coupler is utilized. In case of such a focusing grating coupler, chromatic aberration is large when the wavelength of the light from the light source is varied due to temperature variations and the like. Although this prior art describes that there is no change in the wavelengths when the surface emitting laser is employed, there is adverse influence since the wavelength is changed by the temperatures, as apparent from the publication "SURFACE EMITTING LASER" written by Iga, FIG. 12, page 8, vol. 60, No. 1, APPLIED PHYSICS, 1991. Accordingly, this prior art owns such a problem that no solution means is taken to the wavelength variation.

Furthermore, as to the optical head described in JP-A-64-46242, the optical path to the optical disk is inclined in order to separate the optical path for the laser light emitted from the surface emitting laser to the optical disk, from the optical path for the light returned from the optical disk to the photodetector. When the optical path is inclined, there is a problem that aberration and also asymmetrical strength distributions may easily occur, resulting in a large spot size of the laser light. It should be noted that the applications of the SCOOP structure have been proposed in this prior art, taking account of such a problem caused by the inclined optical path. However, since only differences in reflectivities of the medium can be detected in case of the SCOOP structure, there are drawbacks that neither the tracking signal, nor the opto-magnetic signal can be detected.

On the other hand, in the optical head described in JP-A-64-43822, since the optical head is mounted on the flying slider separately manufactured, it is very difficult to adjust the slider surface and the optical head within the normal focal depth from 2 micrometers to 3 micrometers. If the automatic focusing control would be performed, then this focal depth adjustment would not be required. However, since JP-A-64-43822 has such an object that this automatic focusing control is not performed, the above-explained difficult focal depth adjustment must be carried out.

It should also be noted that JP-A-64-43822 never discloses a method for manufacturing an optical head with employment of a surface emitting laser, and also an optical disk apparatus suitable for a flying type optical head.

SUMMARY OF THE INVENTION

A primary object of the present invention is therefore to provide an optical head capable of reducing chromatic aberration caused when wavelengths of light emitted from a light source are changed due to a variation in temperatures.

A secondary object of the present invention is to provide an improved optical head capable of preventing the above-explained problems caused by the SCOOP structure and by inclining an optical path with respect to an optical disk.

A third object of the present invention is to provide a flying type optical head which deprives such a positional adjustment between a flying slider and this optical head.

A fourth object of the present invention is to provide a method for manufacturing an optical head with employment of a surface emitting laser.

A fifth object of the present invention is to provide an optical disk apparatus suitable for a flying type optical head.

In accordance with a first aspect of the present invention, it is provided an optical head that a semiconductor laser is formed via a buffer layer on a substrate, and an opening portion is fabricated in the substrate at a lower portion of a laser emitting surface;

said opening portion is furthermore filled with a transparent layer;

one of a grating lens, a distributed index lens, and a condenser lens made of a convex lens having a diameter less than 1 mm is formed on a lower surface of said transparent layer.

According to a second aspect of the present invention, it is provided such an optical disk that a semiconductor laser and a photodetector are formed via a buffer layer on the same substrate in such a manner that a laser light emitting surface of the semiconductor laser and a light receiving surface of said photodetector are directed to the same direction, and an opening is fabricated under said laser emitting surface and said light receiving surface;

further, a first transparent layer for filling the opening portion is stacked;

a diffraction grating is formed on a lower surface of said first transparent layer;

a second transparent layer is stacked on a lower surface of said first transparent layer; and a condenser lens constructed of a grating lens, a distributed index lens, or a convex lens is formed on a lower surface of said transparent layer;

wherein laser light emitted from said semiconductor laser is penetrated through said substrate, said first transparent layer, said diffraction grating, and said second transparent layer, and condensed toward a place just under the condenser lens, by said condenser lens, thereby forming a light spot on an optical storage medium positioned apart from said condenser lens, whereas reflection light reflected from said optical storage medium is penetrated through said condenser lens and said second transparent layer, diffracted by said diffraction grating toward a light receiving plane of said photo-detector, and further penetrated through said first transparent layer to be received by said photo-detector.

In accordance with a third aspect of the present invention, it is provided an optical head that a shape of said optical head (106) is processed to become a flying slider shape in an one body.

According to a fourth aspect of the present invention, it is provided a method for manufacturing an optical head-wherein a semiconductor laser and a photo-detector are formed via a buffer layer on the same substrate in such a manner that a laser light emitting surface of the semiconductor laser and a light receiving surface of said photodetector are directed to the same direction, and an opening is fabricated under said laser emitting surface and said light receiving surface by an etching process, characterized by comprising the steps of:

- stacking a first transparent layer used to fill said opening by way of the plasma CVD (Chemical vapor deposition) and sputtering processes;
- forming a second transparent layer under said first transparent layer by way of the plasma CVD, and sputtering processes; and
- forming either a grating lens on a lower surface of said second transparent layer by way of the photomask exposure process, or one of a distributed index lens and a convex lens on said lower surface of said second transparent layer by way of the ion exchange process.

Furthermore, according to the present invention, it may be provided a method for manufacturing an optical head in which a surface emitting laser and a photodiode are manufactured at the same time in accordance with the following processing steps (a) to (f), characterized by comprising the steps wherein:

- (a). an n type AlGaAs buffer layer is grown on an n type GaAs substrate, an n type GaAs layer is grown on said buffer layer, and a first reflection mirror layer constructed by alternately stacking n type AlAs layers and GaAlAs layers is formed on said n+ type GaAs layer;
- (b). said first reflection mirror layer is removed by way of an etching process only from a portion where said photodiode is to be manufactured, and an n type AlGaAs layer, is grown on the layer removed portion;
- (c). an n type AlGaAs clad layer is formed on said first reflection mirror layer and said n type AlGaAs layer, a p type GaAlAs quantum well layer is grown on said clad layer as an activate layer, a p type GaAlAs clad layer is fabricated on said activate layer; and a second reflection mirror layer constructed by alternately stacking n type AlAs layers and GaAlAs layers is grown on said clad layer;
- (d). said second reflection mirror layer is removed by way of the etching process only from the portion where the photodiode is to be formed, and a p type GaAs layer is formed on the removed portion;
- (e). a p+ type GaAs layer is formed on said second reflection mirror layer and said p type GaAs layer, on which an Au electrode is formed; and
- (f). a groove for separating said surface emitting laser from said photodiode is formed.

In accordance with a fifth aspect of the present invention, it is provided an optical disk apparatus comprising:

- a flying type optical head whose flying amount is smaller than, or equal to 26 micrometers;
- an optical disk having no transparent protection layer on the information reading side of the recording surface thereof, or having a transparent protection layer with a thickness less than a value obtained by subtracting said flying amount from a back focus distance of an object lens located within a medium whose refractive index is 1.0, and by multiplying the subtraction result by a refractive index of a protection layer;
- a supporting mechanism for supporting said optical head; and
- a dust-guard cartridge for containing at least said optical disk, said optical head, and said supporting mechanism.

In the optical head according to the first aspect of the present invention, since the semiconductor laser is formed via the buffer layer and the opening portion is fabricated on the lower portion of the laser light emitting surface of the substrate, attenuation of the layer light is lowered. As previously discussed the condenser lens having the diameter smaller than, or equal to 1 mm is formed on the lower surface of the transparent layer stacked under the substrate. When the diameter of the condenser lens is selected to be smaller than, or equal to 1 mm, as will be explained later, the wave front precision of $0.1\lambda$ can be realized even when the variations in wavelengths become $\Delta\lambda=3$ nm, so that there is no problem about chromatic aberration caused by the variation in the wavelengths of the light emitted from the light source due to the temperature changes.

In the optical head according to the second aspect of the present invention, the diffraction grating is provided between the semiconductor laser and the condenser lens, the laser light projected from the condenser lens and reflected by the optical storage medium, is again incident upon this condenser lens, and thereafter this reflected laser light is directed toward the light receiving surface of the photodetector capable of detecting the tracking signal and the opto-magnetic signal. As a result, this optical head can prevent the conventional problems caused by setting the optical path to be inclined with respect to the optical disk and by the SCOOP structure.

In the optical disk according to the third aspect of the present invention, and the flying slider is formed with the optical head main body in an integral form, and the film thickness of the ceramic material such as zirconia is controlled and is formed by way of the sputtering process, so that the positioning adjustment between the flying slider and the optical head is no longer required.

In accordance with the method for manufacturing the optical head of the fourth aspect of the present invention, the optical head of the present invention can be manufactured by employing the semiconductor process such as the photomask exposure process. Also, both the surface emitting laser and the photodiode can be manufactured at the same time.

In the optical disk apparatus according to the fifth aspect of the present invention, the flying type optical head whose flying amount is smaller than, or equal to 20 micrometers, and the below-mentioned optical disk are employed. That is, this optical disk has either no transparent protection layer at the information reading side of the storage surface thereof, or a transparent protection layer whose thickness is less than a value obtained by subtracting the flying amount from the back focus distance of the object lens located within the medium whose refractive index is 1.0, and by multiplying the subtraction result by a refractive index of the protection layer. As will be described later, when the flying amount is below than 26 micrometers, the flying variation amount is below than 2.6 micrometers, so that this flying variation amount can be absorbed by the focal depth of the condenser lens. As a result, the recording surface can be read without the defocusing control. When the thickness of the protection layer becomes thin, the optical disk may be damaged by dust. Therefore, since this optical disk is contained into the dust-guard cartridge, there is no practical problem in using the optical disk.

BRIEF DESCRIPTION OF THE INVENTION

FIG. 1 is a cross-sectional view for showing an optical head according to an embodiment of the present invention;

FIG. 2 explanatorily shows a relationship between a diffraction grating and a photodiode;

FIG. 3 explanatorily indicates variations in a light distribution on the photodiode, caused by defocus;

FIG. 4 schematically shows a circuit diagram of a signal pickup circuit from the optical head of FIG. 1;

FIGS. 5A to 5F are sectional views for illustrating a manufacturing method of the optical head shown in FIG. 1;

Figure 1:
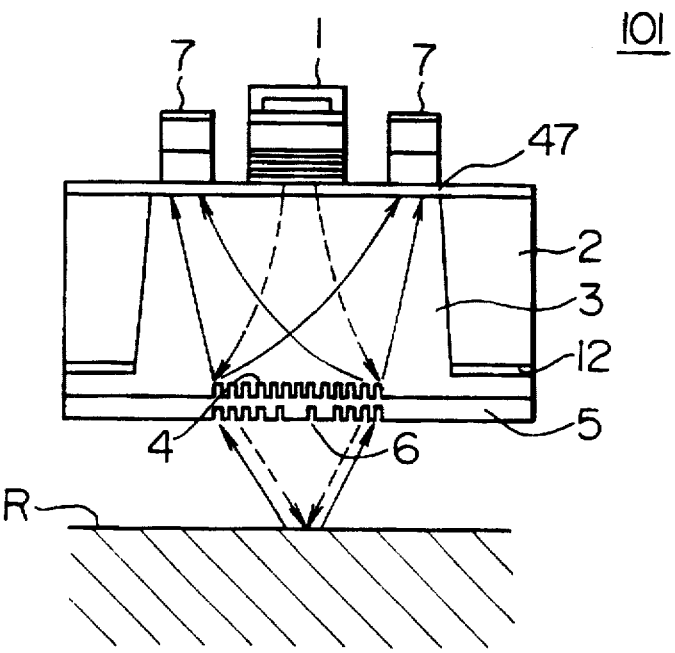
Figure 10:
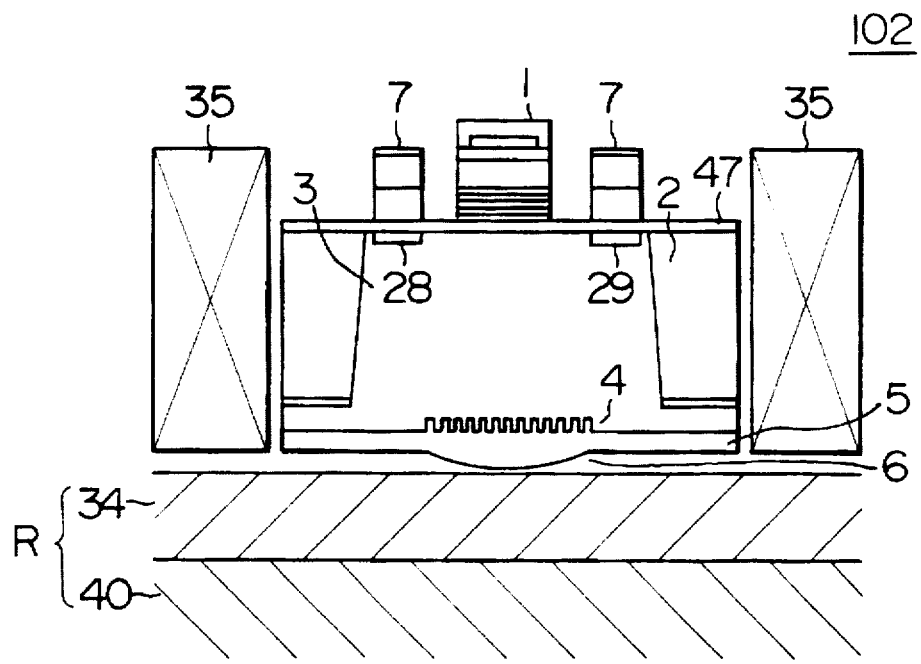
FIG. 10 is a sectional view for representing an optical head according to another embodiment of the present invention.
Figure 11:
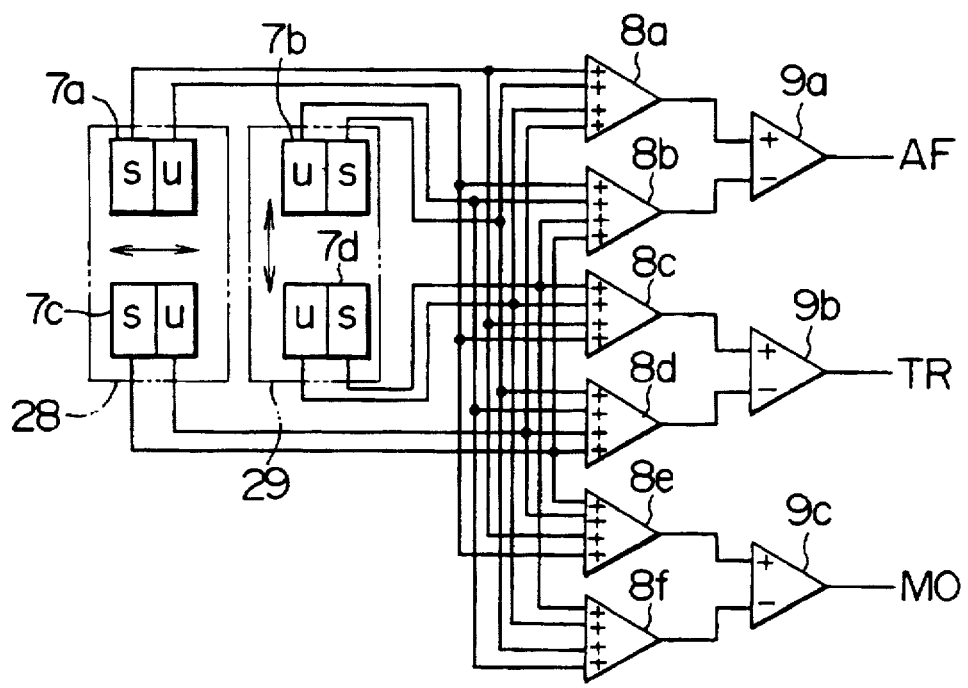
Figure 12:
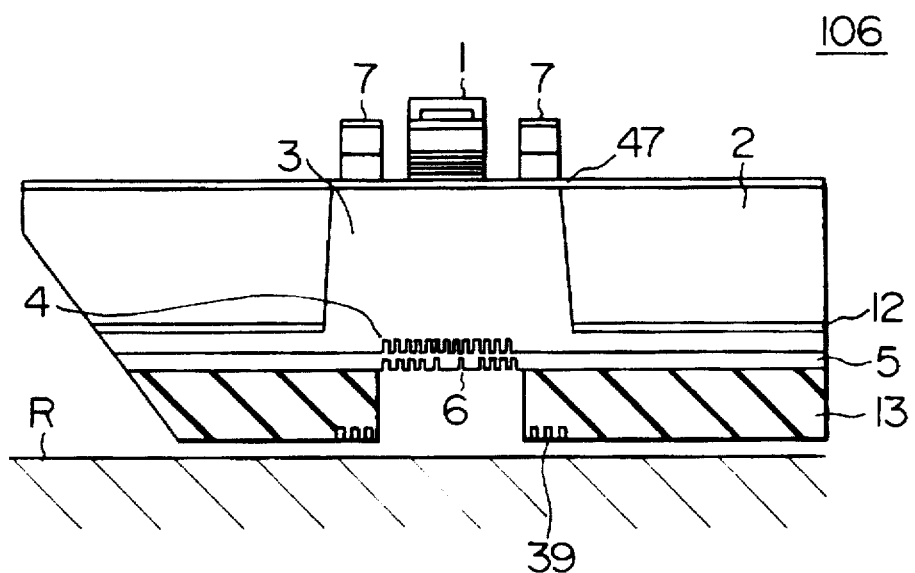
Figure 13A:
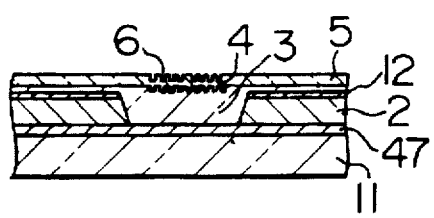
Figure 13C:
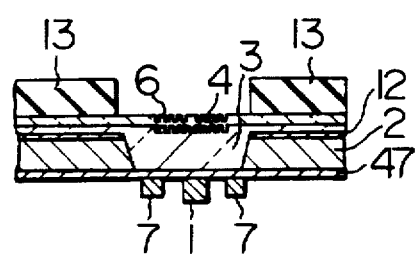
Figure 13B:
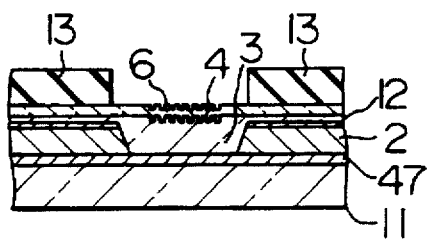
Figure 14:
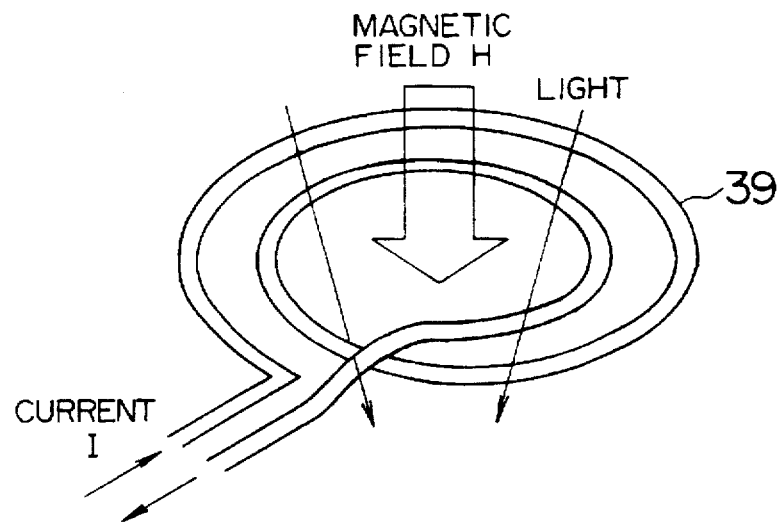
Figure 15:
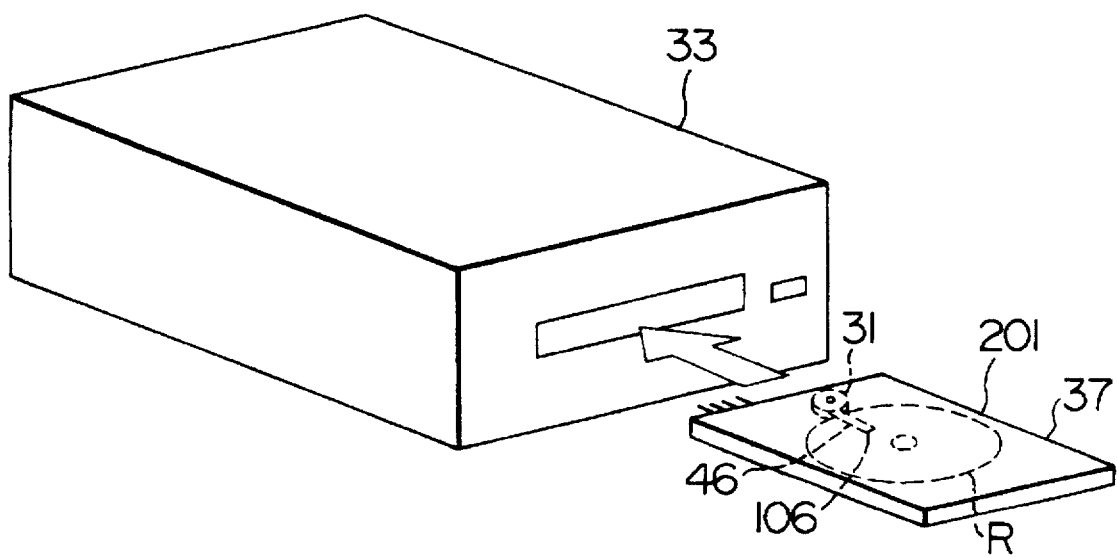
Figure 16:
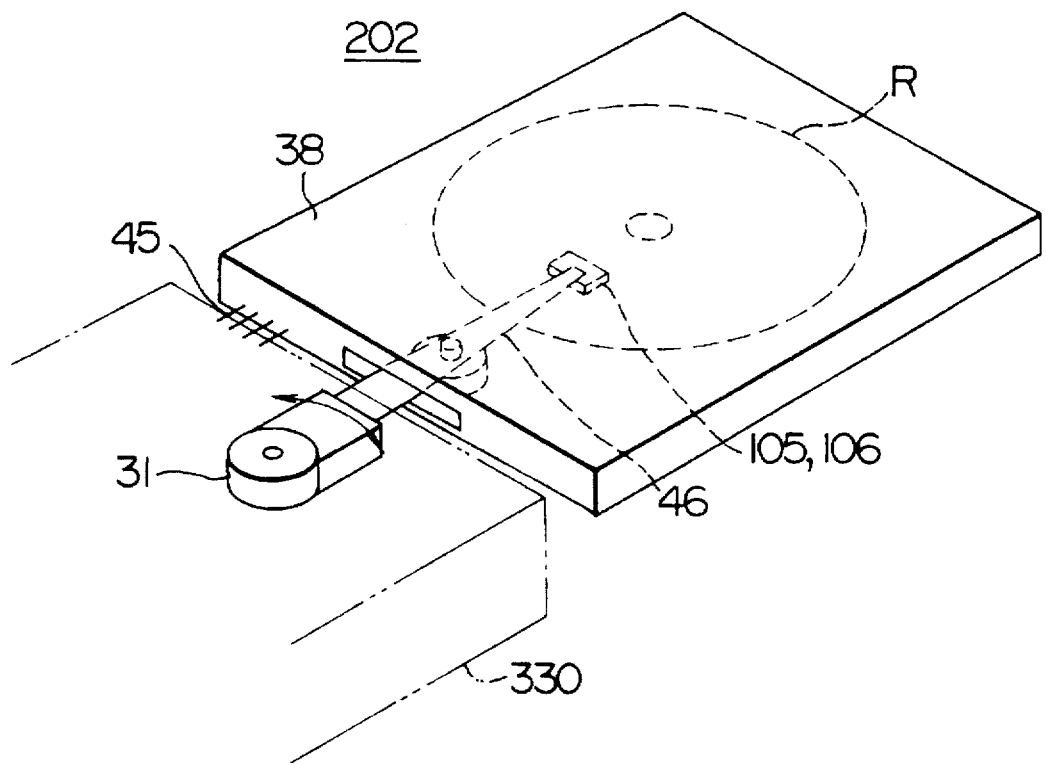
Figure 17:
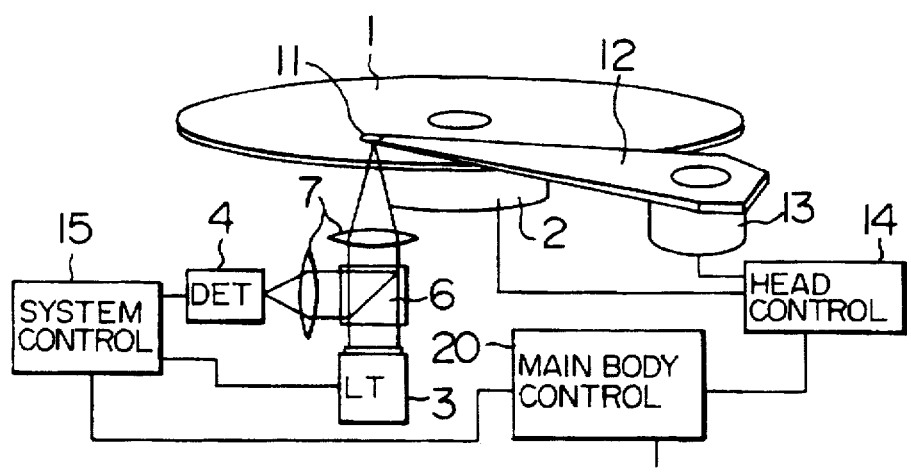
Figure 18A:
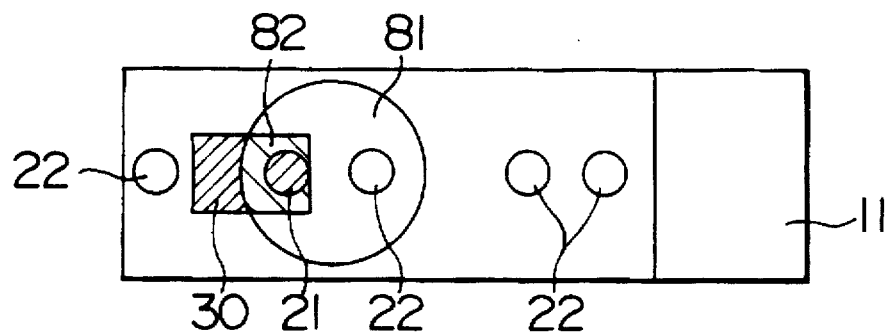
Figure 18B:
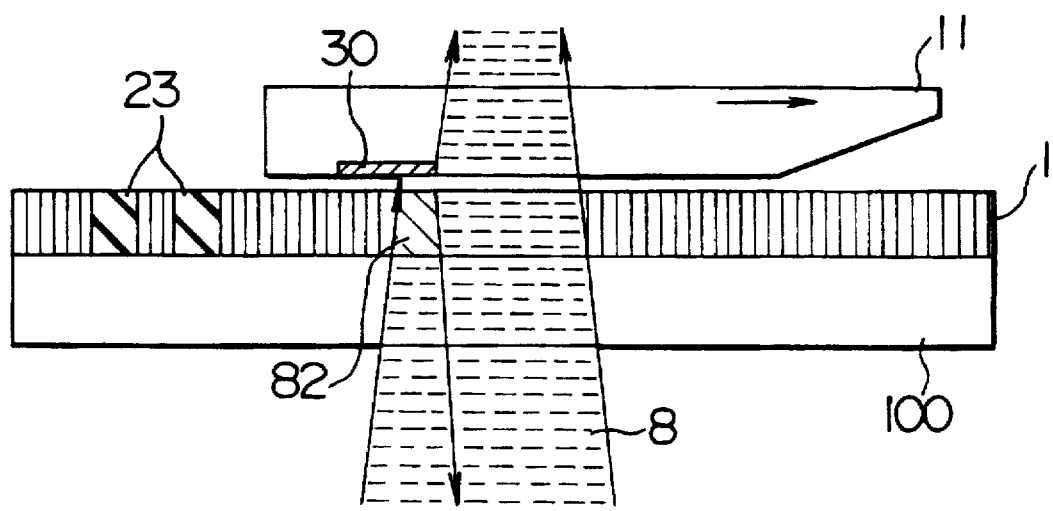
Figure 19:
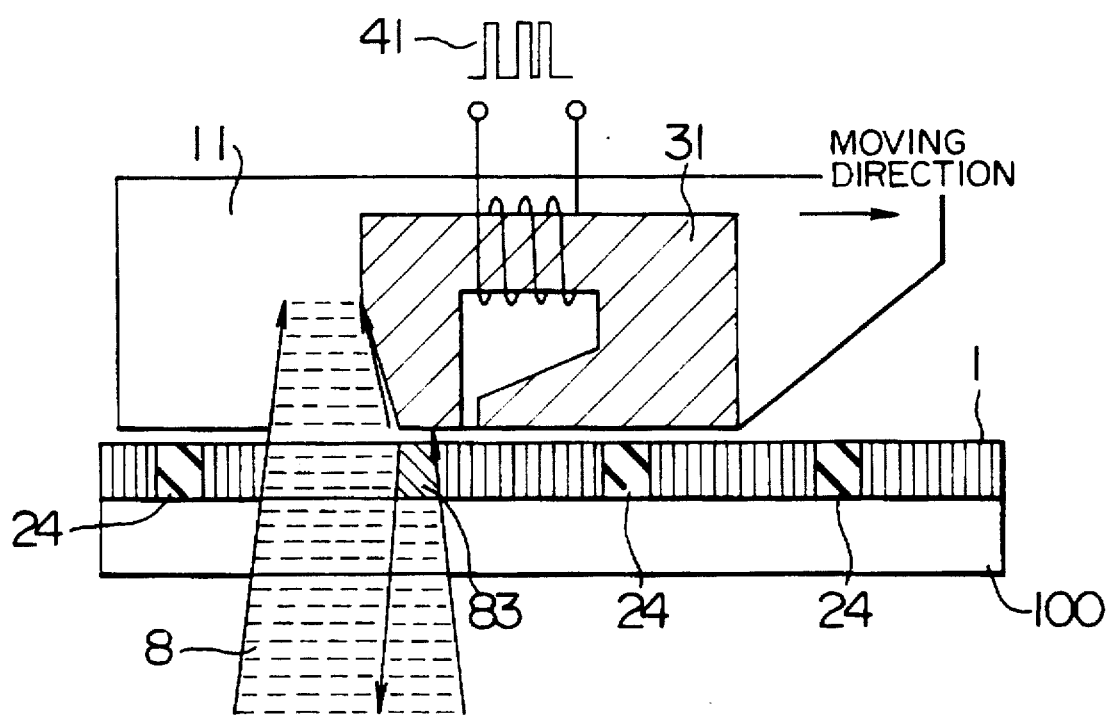
Figure 20A:
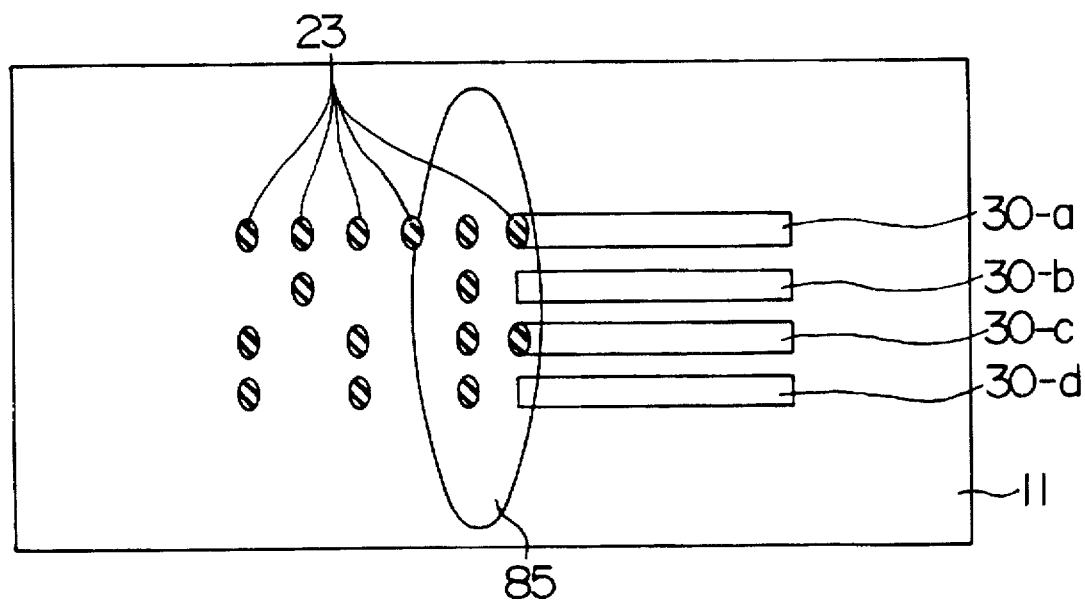
Figure 20B:
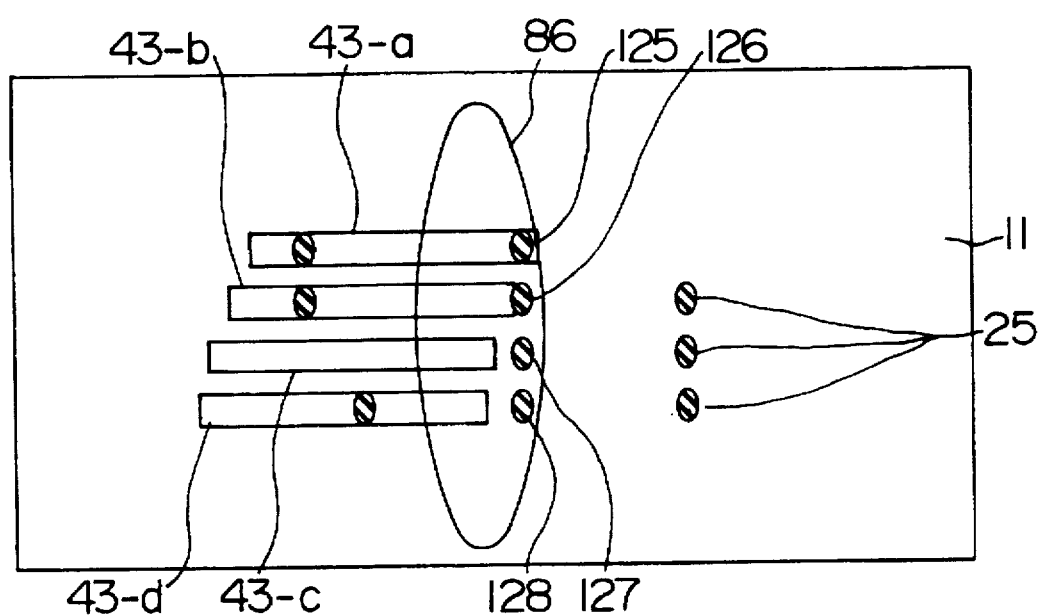
Figure 22:
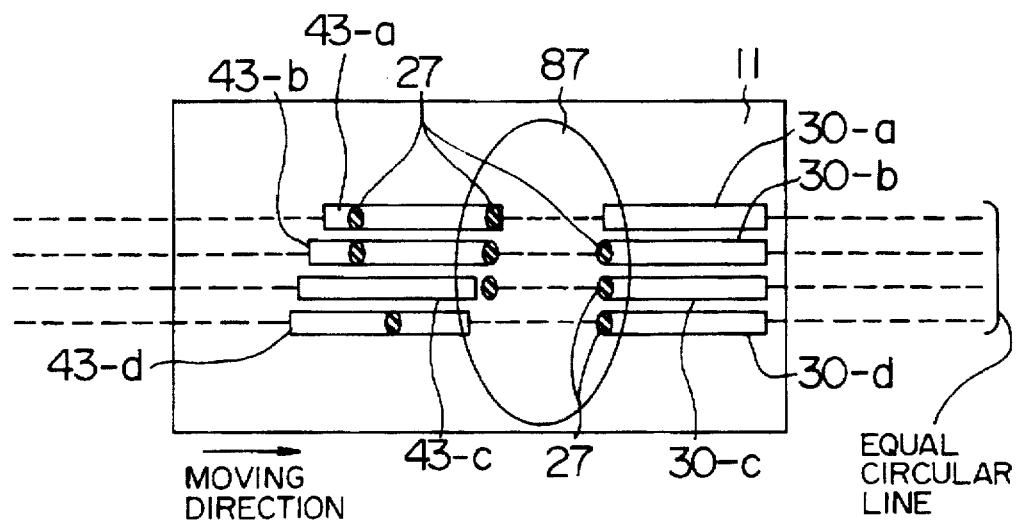
Figure 22:
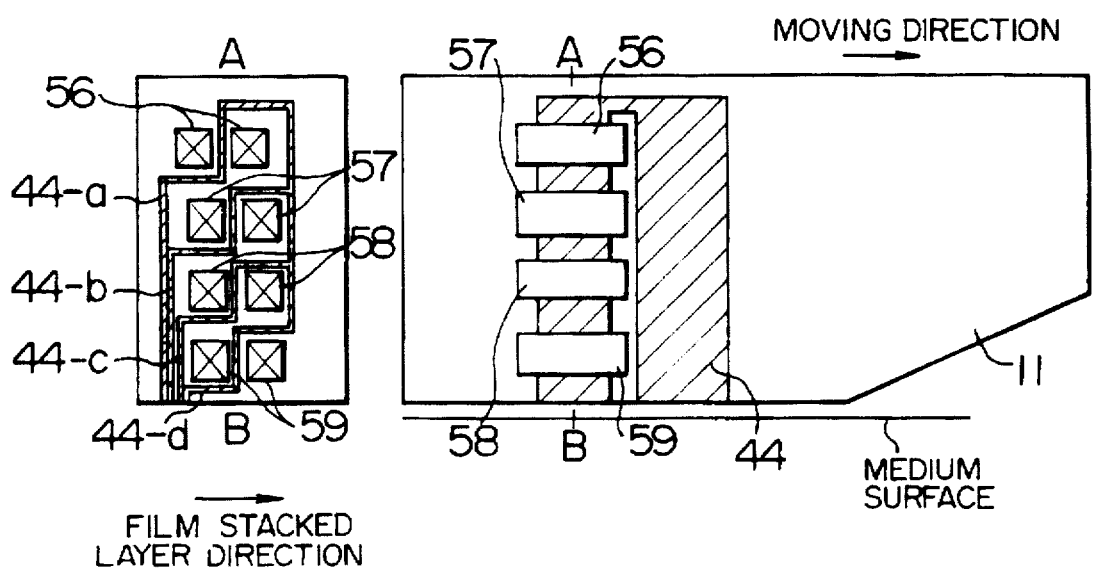

FIG. 11 schematically indicates a circuit diagram of a signal pickup circuit from the optical head of FIG. 10;

FIG. 12 is a sectional view for denoting an optical head according to a further embodiment of the present invention;

FIGS. 13A to 13C are sectional views for showing a manufacturing method of the optical head of FIG. 12;

FIG. 14 is an explanatory diagram of a magnetic coil and a magnetic field thereof in the optical head shown in FIG. 1;

FIG. 15 is a perspective view of an optical disk apparatus according to an embodiment of the present invention;

FIG. 16 is a perspective view of an optical disk apparatus according to another embodiment of the present invention;

FIG. 17 is a constructive diagram for indicating an overall arrangement of an optical disk apparatus according to another embodiment of the present invention;

FIG. 18A is a bottom vie of the magnetic head according to an embodiment of the present invention;

FIG. 18B is a sectional view of this magnetic head;

FIG. 19 is a sectional view of a magnetic head according to another embodiment of the present invention;

FIG. 20A explanatorily shows a parallel writing operation according to an embodiment of the present invention;

FIG. 20B explanatorily indicates a parallel reading operation thereof;

FIGS. 21A to 21E are explanatory diagrams for showing detection signals obtained during the parallel reading operation;

FIG. 22 schematically indicates a positional relationship between mirrors for the parallel writing operation and mirrors for the parallel reading operation; and FIGS. 23A and 23B are sectional views for denoting a parallel input/output head according to an embodiment of the present invention.

DESCRIPTION OF THE PREFERRED EMBODIMENTS

Referring now to the drawings, embodiments of the present invention will be described.

FIG. 1 is a sectional view for showing a structure of an optical head 101 according to an embodiment of the present invention.

This optical head 101 has the following structure. That is, both a surface emitting laser 1 and photodiodes 7, 7 are fabricated via an AlGaAs buffer layer 47 on an n-GaAs substrate 2 in such a manner that both a laser light projecting surface of the semiconductor laser 1 and light receiving surfaces of the photodiodes 7, 7 are directed toward the n-GaAs substrate 2. Opening portions are formed in the laser light projecting surface and lower substrates of the light receiving surfaces. Further, the opening portions are filled with a first glass layer 3, a diffraction grating 4 is fabricated on the lower surface of this first glass layer 3. A second glass layer 5 is stacked on the lower portion of the first glass layer 3. On the low surface of this second glass layer 5, a condenser lens 6 having a diameter smaller than, or equal to 1 mm and constructed of a grating lens is formed.

The laser light (indicated by a dot line of FIG. 1) projected from the surface emitting laser 1 is traveled through the buffer layer 47, the first glass layer 3, the diffraction grating 4, and the second glass layer 5. This laser light is then condensed by the condenser lens 6 in such a manner that the laser light is directed just under the condenser lens 6, and a light spot having a diameter from 0.4 micrometers to 2 micrometers is formed on a recording plane of an optical recording medium R located apart from the condenser lens 6. A distance between the condenser lens 6 and the recording plane of the optical recording medium R is selected to be smaller than, or equal to approximately 1 mm.

Reflection light (indicated by a solid line of FIG. 1) reflected from the recording plane of the optical recording medium R is transmitted through the condenser lens 6 and the second glass layer 5, and then diffracted by the diffraction grating 4 in such a manner that the diffracted laser light is directed toward the light receiving planes of the photodiodes 7 and 7. Thereafter, the diffracted laser light is transmitted through the first glass layer 3 and received by the photodiodes 7, 7.

The reason why the buffer layer is formed in the lower portions of the laser light projection surface and the light receiving plane, and the opening portions are formed in the substrate 2, is such that GaAs substrate which greatly absorbs the laser light with respect to the laser oscillating wavelength ($\alpha=10^4$ cm$^{-1}$) is removed, and the laser is supported by the AlGa buffer layer which weakly absorbs the laser light ($\alpha=20$ cm$^{-1}$). Even when AlGaAs is employed, since electric conductivity is not changed, the thickness of this buffer layer is made thick to lower the electric resistance without light absorption loss. Also, the reason why the diameter of the condenser lens 6 is selected to be smaller than, or equal to 1 mm. is to suppress chromatic aberration caused when the wavelength of the laser light is varied due to temperature changes, below than at least $\lambda/4$ at maximum.

That is, spherical aberration "W" of a hologram is given as follows, assuming now that a height of incident light from an optical axis on the hologram is "h";

$$W(h) = A\,h^4 \qquad (1)$$

(see "OPTICAL ENGINEERING HANDBOOK" edited by T. Kase et al., ASAKURA publisher, page 180). Here, assuming now that a distance from the hologram and an object point is "Ro", a distance from the hologram to a reference light source for recording is "Rr", a distance from the hologram to a reference light source for reproducing is "Rc", a distance from the hologram to a reproduced object point is "Ri", a wavelength for recording is "$\lambda$", and a wavelength for reproducing is "$\lambda'$", it is given:

$$A = \{(\lambda'/\lambda)(1/Rr^3 - 1/Ro^3) - 1/Rc^3 + 1/Ri^3\} \qquad (2)$$

On the other hand, an imagery relationship is defined as follows:

$$1/Ri = 1/Rc + (\lambda'/\lambda)(1/Ro - 1/Rr) \quad (3)$$

Now, it is assumed that $Rr \to \infty$ and $Rc \to \infty$, the spherical aberration is given as follows:

$$W(h) = (1/8Ro^3)\{(\lambda'/\lambda)^3 - (\lambda'/\lambda)\}h^4 \quad (4)$$

When a variation in wavelengths "$\Delta\lambda$" and a numerical aperture "NA" are defined by $$\lambda'/\lambda = (\lambda + \Delta\lambda)/\lambda \quad (5)$$

$$(NA) = h/Ro \quad (6),$$

the spherical aberration is expressed by:

$$W(h, NA) = \{(NA)^3 \Delta\lambda/(4\lambda)\}h \quad (7)$$

In other words, it may be understood that when the numerical aperture NA is constant, the maximum spherical aberration "W" caused by the variation in wavelengths "$\Delta\lambda$" is directly proportional to the height "h" of the incident light from the optical axis on the hologram. For instance, when the various conditions are given as NA = 0.55, $\lambda = 0.78$ micrometers, and $\Delta\lambda = 3$ nm, the spherical aberration "W" is obtained as follows:

$$W(h=2.0 \text{ mm}) = 0.41\lambda$$

$$W(h=1.0 \text{ mm}) = 0.21\lambda$$

$$W(h=0.5 \text{ mm}) = 0.10\lambda$$

As a result, when the aperture "2h" of the condenser lens 6 would be selected to be smaller than, or equal to 1 mm, even if the variation in wavelengths is 3 nm, the spherical aberration could be suppressed below than $\lambda/10$.

This may be similarly applied to such a case that a convex lens is employed as the condenser lens. For example, conceiving now that a lens is made of one surface of a sphere, spherical aberration "W" thereof is given as follows under such assumptions that a refractive index of an object space is 1, a refractive index of an image space is n, and a focal distance is f, $$W(h) = \{3n/(8(n+1)^2 f^3)\}h^4 \quad (8)$$

When numerical aperture "NA" is selected to be $$NA = nh/f \quad (9),$$

spherical aperture is given as follows:

$$W(h) = \{3(NA)^3/(8(n-1)^2 n^2)\}h \quad (10)$$

As a result, it is possible to reduce the spherical aberration when the numerical aperture "NA" is constant, and the aperture "2h" is made small. This fact may be applied not only to such spherical aberration, but also to other types of spherical aberration.

Since the reflection light is branched by employing the diffraction grating 4 to make up the optical path positioned perpendicular to the optical recording medium R, there is no problem caused by such a matter that the optical path is inclined. It should be noted that assuming that the diffraction efficiency together with that of ± first order diffracted light by the diffraction grating 4 is 50%, 25% of the reflection light is returned to the surface emitting laser 1. However, as the mode hop does not easily happen due to the reflection light of the surface emitting laser 1, there is no adverse influence. The light receiving amounts of the photodiodes 7, 7 can become 25%, i.e., the maximum amount.

Figure 2:
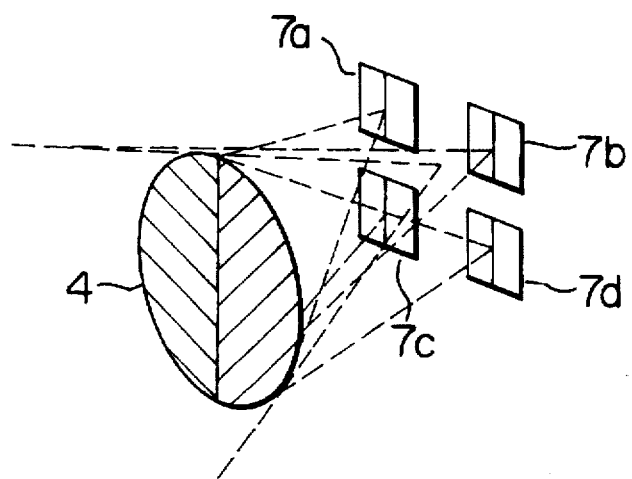

FIG. 2 schematically shows a positional relationship between the diffraction grating 4 and the photodiode 7.

The diffraction grating 4 corresponds to a linear type diffraction grating such that both sides of the grating are intersected with each other at an inclined angle of 45° with respect to center lines positioned at a boundary line and parallel to the recording track direction of the optical recording medium R. 4 photodiodes 7 are positioned in order to receive ± first order diffracted light from the diffraction grating 4. These four photodiodes 7a, 7b, 7c, 7d are further subdivided into two portions along the dividing direction of the diffraction grating 4.

Figure 3:
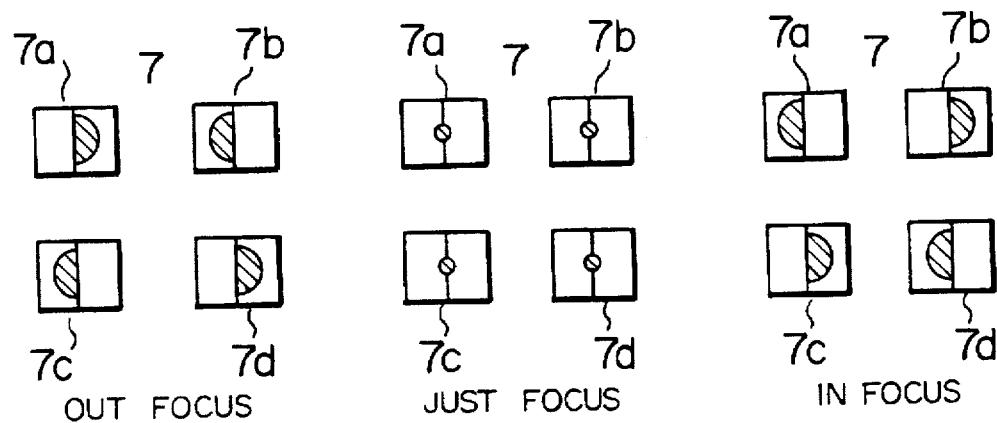

FIG. 3 represents distributions of the reflection light under conditions of "out focus", "just focus" and "in focus", which is incident upon each of the four photodiodes 7a, 7b, 7c, and 7d.

Figure 4:
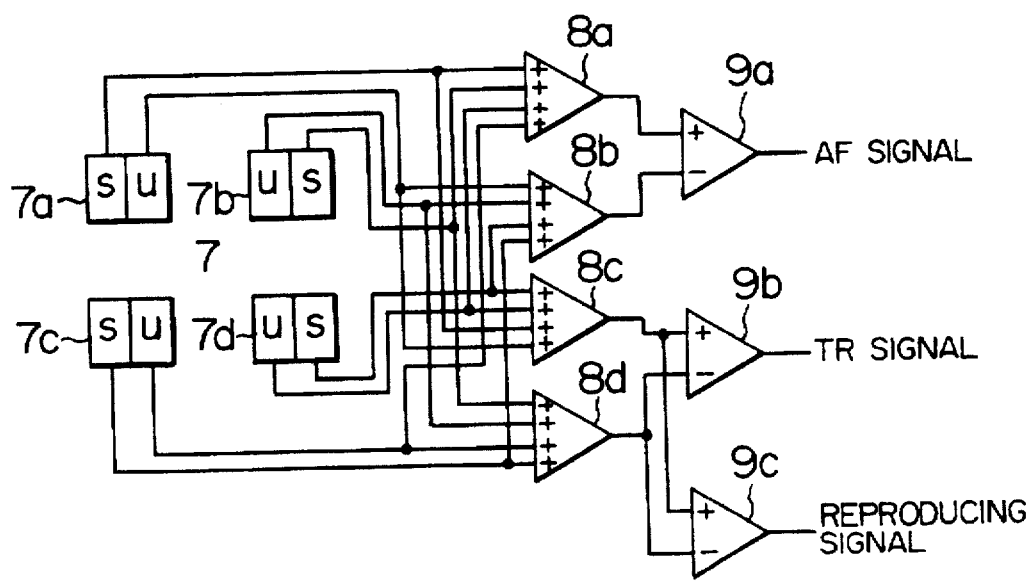

FIG. 4 shows an example of a signal detecting circuit in the optical head 101.

A defocused signal AF is obtained in such a manner that outputs from the four photodiodes located at the outside of the upper stage in FIG. 4 and at the inside of the lower stage thereof, are added to each other in an adder 8a, outputs from the four photodiodes located at the inside of the upper stage and the outside of the lower stage thereof, are added to each other in an adder 8b, and then outputs from both the adders 8a and 8b are processed in a subtracter 9a.

A track shifted signal TR is obtained from a difference between the light amounts of the laser incident upon the right and left sides of the diffraction grating 4 in FIG. 2, because this track shifted signal TR can be produced from uneven light distributions of the reflection light reflected from the optical recording medium R, which is caused by the track shifts. As a consequence, the track shifted signal TR is obtained in such a manner that outputs from the four photodiodes located at the left side of the upper stage in FIG. 4, and right side of the lower stage are added to each other in an adder 8c, outputs from the four photodiodes located at the right inside of the upper stage and the left side the lower stage are added to each other in an adder 8d, and then outputs from both of these adders 8c and 8d are processed in a subtracter 9b.

In case of such an optical disk where the optical recording medium R, is of additionally rewritable type, or of read-only type, a producing signal may be obtained by summing the outputs from all of the photodiodes. As a result, it can be produced by adding the outputs from the adder 8c and 8d in an adder 9c.

In FIGS. 5A–5F, there is shown an example of a method for manufacturing the optical head 101. This optical head manufacturing method is arranged as follows:

As to FIG. 5A, the n-AlGaAs buffer layer 47 is grown on the lower surface of the n-GaAs substrate 2, a reinforcement glass substrate 11 is closely attached to the lower surface of this buffer layer 47, and an Al electrode 12 is vapor-deposited on the upper surface of the n-GaAs substrate 2.

As to FIG. 5B, both the Al electrode 12 and the n-GaAs substrate 2 are etched away to form a hole 2b used for projecting the laser light.

As to FIG. 5C, the first glass layer 3 is deposited on the Al electrode 12 and the n-GaAs substrate 2 by way of such a method as the plasma CVD method and the sputtering method. Then, the deposited first glass layer 3 is smoothed by the polishing method, or photopolymer and the like are filled and hardened, so that the above-described etching hole is filled.

AS to FIG. 5D, the diffraction grating 4 is formed on the upper surface of the first glass layer 3 by way of the photomask exposure process. That is, photo-resist is coated on the upper surface of the first glass layer 3 and dried. Then, a diffraction pattern is exposed on this dried photoresist and developed, and the diffraction grating 4 is fabricated by utilizing the ion beam processing method.

As to FIG. 5E, the second glass layer 5 whose refractive index is different from that of the first glass layer 3 is stacked on the first glass layer 3 by way of either the plasma CVD method, or the sputtering method, and a grating lens 6 is fabricated by the photomask exposure process.

As to FIG. 5F, the reinforcement glass substrate 11 is removed, and the surface emitting laser 1 and the photodiodes 7, 7 are manufactured on the lower surface of the buffer layer 47.

Figure 6:
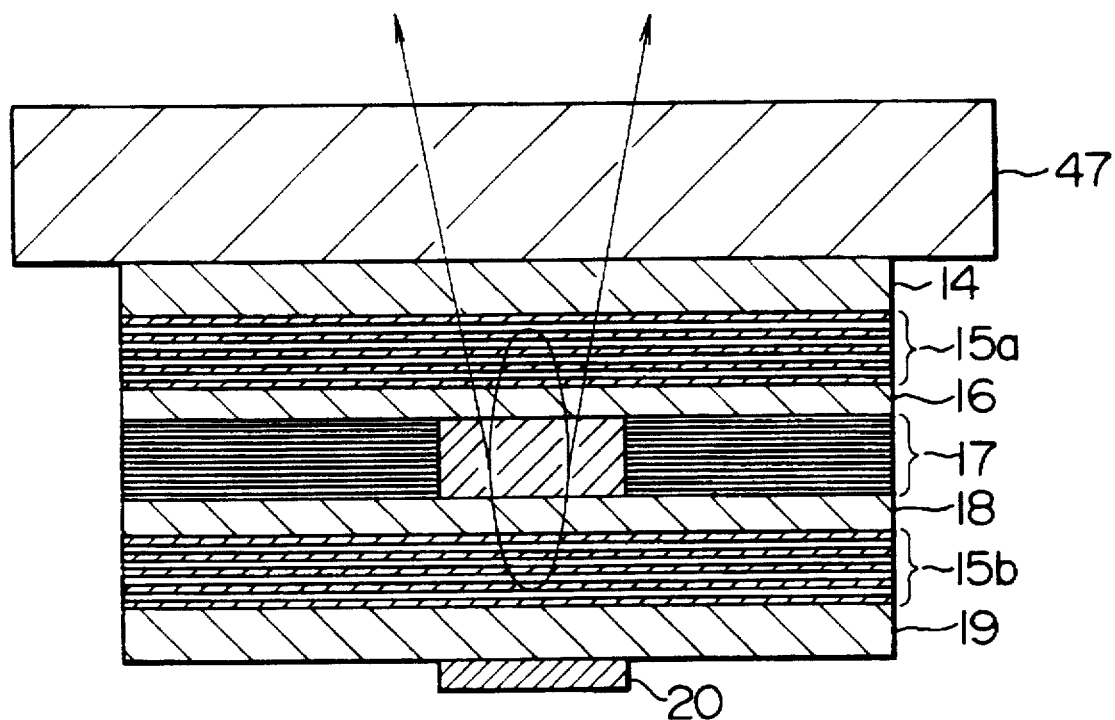
FIG. 6 is a sectional view for indicating a buried type surface emitting laser.

FIG. 6 schematically represents an example of a structure of the buried type surface emitting laser 1.

An n⁺ type GaAs layer 14 into which a large quantity of n type impurity has been added in order to increase conductivity is grown on the n-AlGaAs buffer layer 47. On this n+type GaAs layer 14, a reflection mirror layer 15a is formed in which n type AlAs and GaAlAs are alternately stacked. An n type GaAlAs clad layer 16 is grown on this reflection mirror layer 15. Furthermore, a p type GaAlAs/GaAs quantum well layer 17 is formed as an activated layer. Although a sufficiently good characteristic may be achieved by forming the activated layer by only GaAlAs, a low threshold current can be achieved by employing the quantum well. A p type GaAlAs clad layer 18 is grown on the quantum well layer 17, on which another reflection mirror layer 15b is formed. In this reflection mirror layer 15b, n type AlAs and GaAlAs are alternately stacked. A p type GaAs layer 19 into which a large quantity of p type impurity is added so as to increase conductivity is manufactured on this reflection mirror layer 15b. Finally, an Au electrode 20 is formed.

Figure 7:
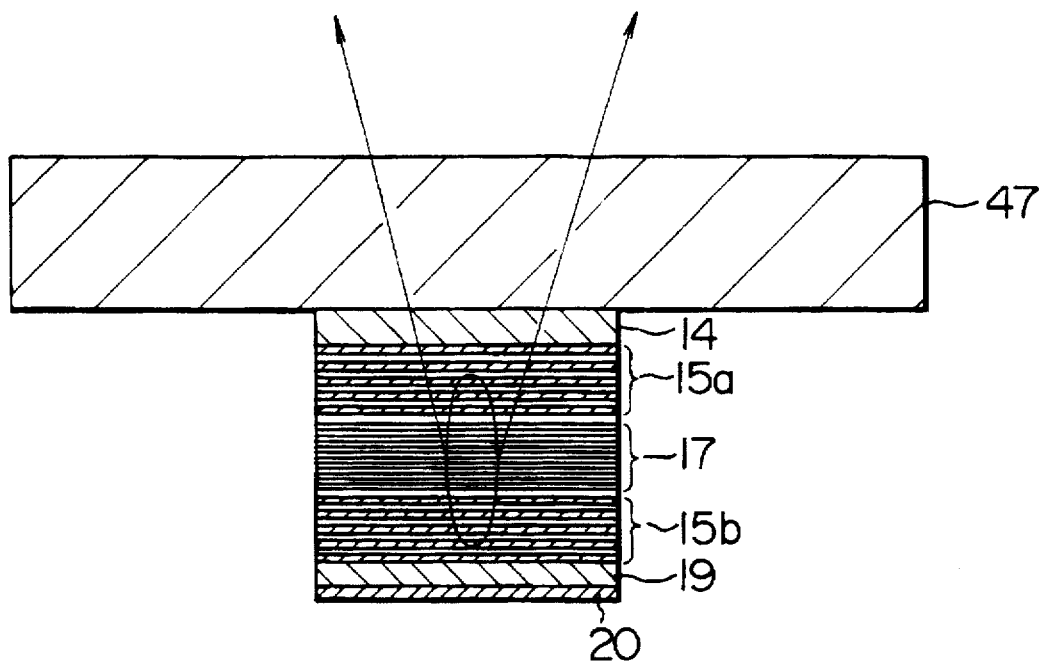
FIG. 7 is a sectional view for showing a mesa type surface emitting laser.

FIG. 7 indicates an example of a structure of a mesa type surface emitting laser 1.

After a structure similar to that of FIG. 6 has been formed, only a cylindrical laser portion is left, while other portions are etched away. A diameter of the cylindrical mesa portion is from 2 micrometers to 3 micrometers, and a height thereof is approximately 5 micrometers. Since the diameter of the mesa portion is small, a projection angle "θ" of the laser from the laser portion is approximately 30° to 44°, namely becomes a large value. As a consequence, for instance, when such a condenser lens 6 whose focal distance is 0.1 mm and whose numerical aperture NA is 0.55, is employed, if the refractive index of the glass layer is selected to be 1.5, then the distance measured from the surface emitting type laser 1 to the condenser lens 6 may be 220 to 320 micrometers, namely may be made extremely short, so that the optical head 101 can be made compact. Also, since the surface emitting type laser 1 is of the mesa type surface emitting laser and thus the confinement effects of the photoelectric field and the injected current are increased, the low-threshold current can be obtained.

Figure 8:
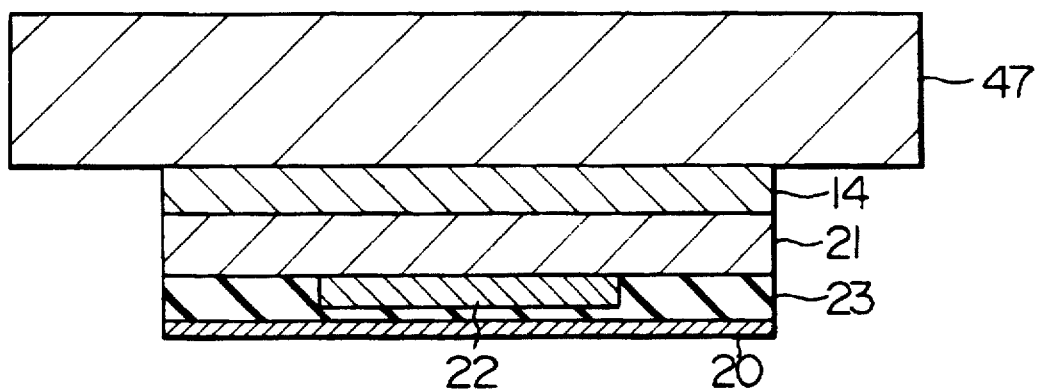
FIG. 8 is a sectional view for representing a photodiode.

FIG. 8 schematically shows an example of a structure of the photodiode 7.

An n⁺ type GaAs layer 14 into which a large quantity of n type impurity is added is grown on the n type AlGaAs buffer layer 47. A GaAs layer 21 into which no impurity is doped is grown on this n⁺ type GaAs layer 14. Further, a p type GaAs layer 22 is partially grown on the GaAs layer 21. A portion of the p type GaAs layer 22 is masked to form as SiO₂ insulating layer 23. Subsequently, this mask is removed to fabricate an Au electrode 20.

It should be understood that although, normally, the photodiode 7 is manufactured after the surface emitting laser 1 has been manufactured, both of the laser and the photodiode may be fabricated.

In FIGS. 9A–9D, there is shown a method for manufacturing both the surface emitting laser 1 and the photodiode 7 at the same time.

Figure 9A:
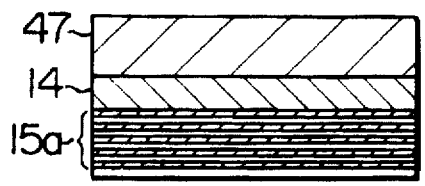
FIGS. 9A to 9D are sectional views for indicating a simultaneous manufacturing method of the surface emitting laser and the photodiode.

As to FIG. 9A, an n⁺ type GaAs layer 14 into +which a large quantity of n type impurity is added so as to increase conductivity, is grown on the n type AlGaAs buffer layer 47. A reflection mirror layer 15a manufactured by alternately stacking n type AlAs layers and AlAs layers is formed on this n⁺ type GaAs layer 14.

Figure 9C:
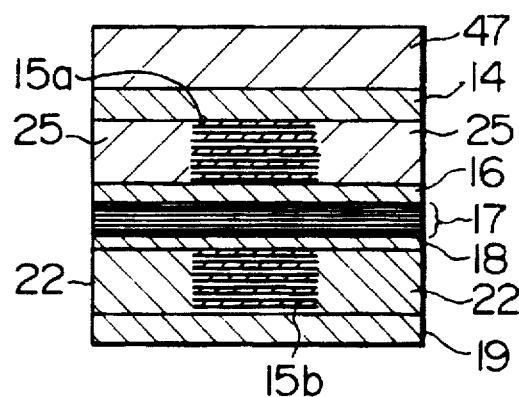
Figure 9B:
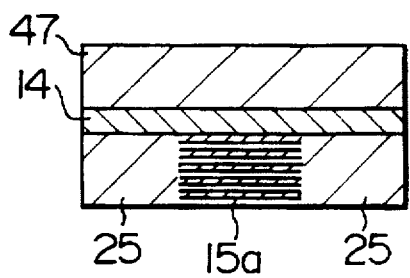

As to FIG. 9B, only the reflection mirror layer 15a where the photodiode 7 is to be formed, is removed. An n type AlGaAs layer 25 is grown on the portion from which the reflection mirror layer 15a has been removed.

As to FIG. 9C, an n type AlGaAs clad layer 16 is formed on the reflection mirror layer 15a and the n type AlGaAs layer 25. A p type GaAlAs/GaAs quantum well layer 17 is grown as an activate layer on the reflection mirror layer 15a and the n type AlGaAs layer 25. A p type GaAlAs clad layer 18 is formed on this activate layer 17. A reflection mirror layer 15b manufactured by alternately stacking n type AlAs layers and GaAlAs layers is grown on this clad layer 18. Only the reflection mirror layer 15b where the photodiode 7 is to be formed, is removed by way of the etching process. Then, a p type GaAs layer 22 is formed on the portion from which the reflection mirror layer 15b has been removed. A p type GaAs layer 22 is formed on the above-described portion from which the reflection mirror layer 15b has been removed. In addition, a P⁺ type GaAs layer 19 into which a large quantity of p type impurity is added to increase conductivity is formed on both the reflection mirror layer 15b and the p type GaAs layer 22.

Figure 9D:
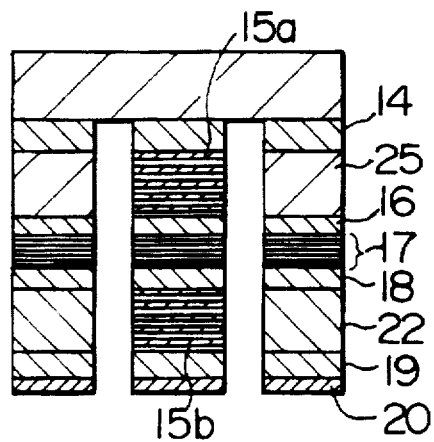

As to FIG. 9D, an Au electrode 20 is fabricated on the p⁺ type GaAs layer 19. Then, the surface emitting laser 1 is separated from the photodiode 7 by the etching process.

As described above, when both the surface emitting laser 1 and the photodiode 7 are manufactured at the same time, the overall manufacturing stage can be considerably simplified and thus these components can be manufactured at low cost.

FIG. 10 is a cross-sectional view of an optical head 102 according to another embodiment of the present invention. The same reference numerals of the previous embodiment shown in FIG. 1 indicate the same constructions in FIG. 10.

This optical head 102 employs a convex lens, while the condenser lens 6 employed in the optical head 101 of FIG. 1 is a grating lens. Film-shaped polarizers 28 and 29 are attached to a lower substrate 2a positioned just under the photodiode 7 in the optical head 101 shown in FIG. 1. Each of these polarizers 28 and 29 owns transmission polarizing directions perpendicular to each other. It should be noted that in case when the transmission polarizing directions of the polarizers 28 and 29 are inclined at ±45° with respect to the polarizing direction of the reflection light, the highest detection sensitivity can be realized (see Japanese publication OPTICS "MAGNETO-OPTICAL RECORDING TECHNIQUES" written by Ozima and Kakuta, volume 18, No. 11, page 599 in 1989).

FIG. 11 shows an example of a signal detecting circuit employed in the optical head 102.

A defocused signal AF is obtained in such a manner that outputs from the four photodiodes positioned at the outside of the upper stage and the inside of the lower stage shown in FIG. 11 are added to each other in an adder 8a, outputs from the four photodiode located at the inside of the upper stage and the outside of the lower stage are added to each other in an adder 8b, and outputs from these adders 8a and 8b are subtracted in a subtracter 9a.

A track shifted signal TR is produced in such a manner that outputs from the four photodiodes located at the left side of the upper stage in FIG. 11 and the right side of the lower stage are added to each other in an adder 8c, and outputs from the four photodiodes positioned at the right inside of the upper stage and the left side of the lower stage are added to each other in an adder 8d, and thus outputs from both of these adders 8c and 8d are subtracted in a subtracter 9b.

In case of the optical disk where the optical recording medium R is of the rewritable MO type, an optical magnetic signal MO may be obtained by subtracting a summation of the outputs from the photodiodes contained in the polarizer 28 from a summation of the outputs from the photodiodes contained in the polarizer 29. As a consequence, the outputs from the four photodiodes located at the left side of the upper stage and the left side of the lower stage are added in an adder 8e, the outputs from the four photodiodes positioned at the right inside of the upper stage and the right side of the lower stage are added in an adder 8f, and the outputs derived from these adders 8e and 8f are subtracted in a subtracter 9d.

This optical head 102 is further equipped with an AF actuator 35.

The optical recording medium R is an optical disk. Generally speaking, an optical disk has a transparent protection layer 34 having a thickness of 1.2 mm at an information reading side of a recording surface 40.

For instance, when a condenser lens 6 in a finite system with the numerical aperture NA=0.3 at the laser side is utilized, a distance from the surface emitting type laser 1 and the condenser lens 6 is approximately 2 mm, and a dimension of the optical head 104 is about 3 mm×3 mm×3 mm.

FIG. 12 is a cross sectional view of another optical head 106 according to another embodiment of the present invention.

This optical head 105 is such a flying slider-shaped optical head that a slider bottom reinforcement layer 13 made of a ceramic material such as zirconia is further formed on the bottom of this optical head.

Since the flying slider is formed in an integral form with the optical-head by way of the film forming process, no positioning adjustment of the optical head is required for the slider bottom.

A flying amount of the optical head 106 depends upon the shape of the optical head 106 and the linear velocity of the optical recording medium R, for instance is smaller than, or equal to 26 micrometers. A variation amount in the flying amounts corresponds to approximately 10% of the flying amount. Accordingly, the variation in the flying amount of 20 micrometers becomes about 2.6 micrometers. The focal depth of the condenser lens 6 is approximated to $\lambda/NA^2$. Therefore, if $\lambda=0.78$ micrometers and NA=0.55, then the focal depth is approximately 2.6 micrometers. At this time, since the flying variation amount of 2.6 micrometers is lower than the focal depth of the focal lens 6, the control to current focusing shifts is no longer required. In other words, the flying variation amount may be selected to be lower than the focal depth of the condenser lens 6. It should be noted that the optical recording medium R does not have the transparent protection layer at the information reading side of the recording surface, or the thickness of the transparent protection layer is thinner than a value calculated by subtracting the flying amount from the back focus distance of the condenser lens in the medium with the refractive index of 1.0, and by multiplying the subtracted value by the refractive index of the protection layer. When either the optical recording medium has no transparent protection layer, or the thickness of the transparent protection layer is less than 100 micrometers, if dust is attached on the surface of this optical recording layer, there is a problem in information reading operations, so that this optical recording medium R must be stored into a dust-proof case.

It should be noted that if the control to correct defocusing is not required, the detecting circuit portions for the defocusing signal employed in the signal detecting circuits of FIGS. 4 and 11 is no longer required, and the recording surface of the optical recording medium can be read out without the defocusing control.

In FIGS. 13A–13C, there is represented a method for manufacturing the optical head 106.

FIG. 13A shows a structural condition manufactured by the manufacturing process as explained in FIGS. 5(a) to 5(f).

As to FIG. 13B, the portion of the grating lens 6 is masked around which ceramics of zirconia is deposited by way o the sputtering method, resulting in a slider bottom reinforcement layer 13. A thickness of the deposition is equal to such a value calculated by subtracting from the back focus distance (i.e., a distance from the lens surface and the focal point in air) of the grating lens 6, a thickness value obtained by diving both the flying amount and the thickness of the optical disk's protection layer by the refractive index of the protection layer.

As to FIG. 13C, the reinforcement glass substrate 11 is removed to form the surface emitting laser 1 and the photodiodes 7, 7 on the lower surface of the substrate 2.

It should be noted that a thin film type magnetic coil 39 used to apply a magnetic field may be provided with the slider bottom reinforcement layer 13 of the bottom of the optical head 105.

FIG. 14 is an explanatory diagram of a relationship between the magnetic coil 39 and the magnetic fields thereof.

A magnetic field "H" produced by a circular current "I" with a turn number of "n" and a diameter "a", is given on a central axis Z thereof as follows:

$$H = na^2 I/2 \sqrt{(a^2 + z^2)^2}$$

For instance, assuming now that n=5, a=50 micrometers, z=1 micrometer, I=160 mA, the magnetic field H=100 [Oe] may be produced.

FIG. 15 is a perspective view for showing an optical disk apparatus 201 according to another embodiment of the present invention.

This optical disk apparatus 201 is constructed in such a manner that an optical recording medium R having either no transparent protection layer at the information recording side of the recording surface, or a transparent protection layer with a thickness less than approximately 20 micrometers, the flying optical head 106 previously explained in the embodiment, a supporting arm 46 for supporting this flying head 106, and a tracking actuator 31 are built in a dust-proof case 37, and a connection terminal 45 for a power supply and a signal is provided.

The optical disk apparatus 201 can be made very thin and light weight, and also can be constructed as a portable cartridge, since no thick transparent protection layer is provided with the optical recording medium R, and neither the defocusing detection circuit nor the defocusing correction actuator is employed. In this case this optical disk apparatus 201 is used to be detachably connected to an optical disk read/write apparatus 33.

It should be noted that since the drive mechanism and the signal processing circuit for the optical recording medium R may be build also in the optical disk read/write apparatus 33, and neither the optical head, nor the tracking actuator is required, this optical recording read/write apparatus 33 may be made compact and at low cost.

FIG. 16 is a perspective view of an optical disk apparatus 202 according to a further embodiment of the present invention.

A different point of this embodiment from the previous embodiment shown in FIG. 15, is such that a tracking actuator 31 is provided on an optical disk read/write apparatus 330, and is connectable with a supporting arm 46 of the optical disk apparatus 202. Since the optical disk apparatus 202 contains no tracking actuator 31, this optical disk apparatus 202 can be made compact and at low cost.

In accordance with the optical head of the present invention, attenuation of the laser light becomes small, and no problem of chromatic aberration may occur when the wavelengths of the laser light source are varied due to temperature variations. Also, there is no noise problem caused by the laser light returned to the semiconductor laser. Further, there are no problem caused by setting the optical disk to be inclined with respect to the optical disk, and no problem caused by the scoop structure. Moreover, since such a flying slider with a dimension several times layer than that of the optical head is not employed, the overall optical head can be made compact.

Next, a description will now be made of a disk type recording apparatus for recording a large amount of information, in particular an optical disk high density recording apparatus, according to an embodiment of the present invention, suitable for realizing high density recording of information from several thousands $GB/in^2$ to several $TB/in^2$.

Conventionally, in the magneto-optical disk apparatus as described in, for instance, JP-A-52-31703, the information is written in such a manner that the laser light is condensed to the magneto-optical disk, thereby producing the locally high-temperature portion, and the magnetic domain magnetized along the specific direction is written into this high temperature portion by utilizing the thermal magnetizing reaction.

The limitation in storage density of this magneto-optical disk is determined by the diameter of the laser spot. The typical spot diameters of the recently developed recording apparatuses are on the order of 0.8 micrometers, and thus a large storage capacity of approximately 600 MB/sheet is available. To furthermore increase the storage capacity, the diameter of the laser light spot must be made smaller than, or equal to 0.8 micrometers. However, since there is the optical limitation, the diameter of the laser light spot cannot be reduced to an infinite value. Nowadays, approximately 0.5 micrometers are the limit value for the spot diameter. As a consequence, it is conceivable that even when such a writing condition as the strength profile of the laser spot could be optimized, the limit size of the magnetic domain is on the order of 0.3 micrometers. As a result, there is such a problem that information storage density higher than about $2GB/in^2$ cannot be realized in view of the storage capacity.

On the other hand, it is known that the information storage density of the magnetic disk apparatus is generally lower than that of the optical disk. This is caused by such a fact that the smaller the magnetic domain becomes, the weaker the signal strength becomes, whereby it is rather difficult to detect the signal with the weak signal length. Thus, the magnetic domain cannot be subdivided greater than the limited dimension, so that the upper limit value of the storage density is approximately $1GB/in^2$.

In accordance with the below-mentioned embodiment, it is possible to provide a storage apparatus capable of having such a large storage capacity as several tens GB to several $TB/in^2$, although this storage apparatus owns the same dimension as the conventional storage apparatus.

According to the storage apparatus of this embodiment, a very small mirror is provided with facing the optical disk, a head flying in air over the surface of the optical disk, and an optical system including a laser irradiating means and an optical detecting means are employed. Then, the laser light is irradiated from the rear surface of the optical disk onto the region of the optical disk containing the region overlapped with the very fine mirror, whereby storage information is written/read in/from this optical disk region.

The effective spot diameter of the laser light may be made small by reducing the width of the very small mirror smaller than the spot diameter of the laser light irradiated on the optical disk.

The head may has a magnetic pole for writing information, and a mirror surface of this magnetic pole may be utilized as the very small mirror.

A plurality of information writing magnetic poles arranged along a direction substantially normal to the relative movement direction between the optical head and the head, are employed within a single head, and a plurality of information is converted into presence of parallel magnetic poles so as to be written into the optical disk, while the magnetizing polarities of the plural magnetic poles are inverted in correspondence with an arbitrary information series under such a condition that the common laser light, at least a portion of which is overlapped with all of the plural very small mirrors, is irradiated from the rear surface onto the optical disk.

The parallel written information can be temporarily separated from each other and can be detected in such a way that a plurality of readout very fine mirrors are provided with being positionally shifted along the relative moving direction between the optical disk and the head, and the magnetic poles present in the region which is located just under this very fine mirror and has been irradiated by the optical laser, are detected by the photodetector, while the common laser light, at least a portion of which is overlapped with all of the plural very fine mirrors, is irradiated from the rear surface onto the optical disk. The separation of this information may be performed by utilizing the outputs from the photodetector obtained in response to the existing number of the magnetic domain, and also the changing timing of the outputs.

Both the readout very small mirrors, and either the write magnetic poles, or the write very small mirrors are employed, and the readout very small mirrors may be separated from the write magnetic poles, or the write very small mirrors by equal diameter distances with respect to the rotation center of the recording medium.

When either the above-explained very small mirrors, or the magnetic poles functioning as the very small mirrors would be constructed by sections of metal films formed by being laminated on the plane substrate, mirrors with thicknesses of angstrom order could be manufactured, and magnetic poles with thicknesses of angstrom order could also be produced.

When the laser light which has penetrated from the rear surface through the optical disk, is again reflected by the very small mirror provided on the head toward the optical disk, intensity of the light at the portion limited to the region located just under the mirror, and also onto which the laser light has been irradiated, is increased. As a consequence, only the magnetic domain present in this region where the light intensity is increased can be detected by utilizing either the Faraday effect, or the Kerr effect by controlling detection sensitivities of the photodetector, so that information having very small sizes smaller than the size of the laser spot can be read. In other words, according to the present invention, the effective spot diameter of the laser beam can be made small by commonly using the very small mirrors.

Then, as described above, the temperature increase is selectively produced in such a local region having the size smaller than the spot size of the laser, so that the information can be written into the very small magnetic domain having the size smaller than, or equal to 0.5 micrometers, which could not be realized in the conventional magneto-optical disk. The lowering phenomenon of the coercive force of the magnetic film, which is caused by such a local temperature increase, may be utilized in writing information into the very small magnetic domain with use of the magnetic poles.

Also, a plurality of write magnetic poles are employed within a single head, and the above-described effects are applied in parallel to the respective magnetic poles employed in a single head, whereby parallel information can be written by a single head. The parallel information can be separated from each other and read by positionally shifting a plurality of readout mirrors along the relative moving direction of the optical disk and the head.

When either the readout mirrors, or the magnetic domains having the mirror function would be positioned apart from either the write magnetic poles, or the write mirrors by the substantially same radius distance from the rotation center of the medium, since the written magnetic domains are overlapped with the reading portion and also the laser irradiated portion at higher precision within a range where no thermal disturbance of the medium and the head is present, the addressing control of the information could be easily achieved.

FIG. 17 shows an overall arrangement of an optical disk high density recording apparatus according to the present invention.

The optical disk high density recording apparatus is arranged by an optical disk 1, a motor 2 for rotating the optical disk 1, a laser light source 3, a photodetector 4, and a beam splitter 6. This recording apparatus is further constructed of a lens 7, a magnetic head 11 flying by air, a head arm 12, a positioning actuator 13, a head control circuit 14, an optical system control circuit 15, a control system main body 20 and so on. The magnetic head 11 is electrically coupled with the control system main body 20 so as to produce the magnetic field in response to the input/output operations, if required.

As the laser light source 3, for instance, a semiconductor laser for emitting laser light having wavelengths of 780 to 830 nm may be employed. As the photodetector 4, a photomultiplier, an avalanche photodiode, an electronically cooling type photodiode and the like may be employed which have high sensitivities with regard to weak light and also high S/N ratio.

The optical disk 1 is rotated by the motor 2 at speed of, for example, 3000 rpm. The control system main body 20 owns a function capable of addressing storage information by the similar algorithm to that of the conventional disk type memory. A communication line used to input/output information is derived from the control system main body 20, and may be electrically connected with an information processing appliance.

First, a description will now be made of an example of the recording medium of the optical disk 1, in which a magnetic film with a magnetizable axis along a vertical direction with respect to a film surface is employed as this recording medium. As the magnetic film, CoFeNi, barium ferrite, hexagonal ferrite, and the like are utilized. This magnetic film with a thickness of 500 angstrom was coated on the glass substrate. It should be noted that since presence of magnetic domains can be detected by the above-described optical means even when other vertical magnetizable films are employed, the present invention may be of course applied thereto.

In accordance with the present invention, to realize the light detection in the optical disk, as previously explained, the air-flying magnetic head 11, and an optical system for irradiating the laser onto the optical disk and for detecting the laser light are newly employed on the surface of the optical disk. Laser light 8 is used to read storage bits by irradiating the region containing at least the optical disk surface overlapped with the magnetic head 11 from the rear surface of the optical head. The magnetic head was manufactured by forming both a conducting pattern made of a metal film pattern, e.g., Au, and a magnetic pole pattern made of a magnetic metal, e.g., Ni—Fe alloy on a hard substrate material such as alumina-titanium-carbide. Alumina-titanium-carbide is processed by way of the similar processing operation to that for processing the conventional head of the magnetic head, so that this head can air-fly (less than about 0.1 micrometer) from the surface of the optical disk.

In FIGS. 18A–18B, there is shown an enlarged diagram of the magnetic head 11. A very small mirror 30 with a thickness of, for instance, approximately 1000 angstrom was fabricated on the surface of the magnetic head 11 on the side of the optical disk. It should be understood that the thickness of this mirror is not limited thereto, but merely a reflection plane must be formed. The mirror 30 has a rectangular shape with a width of about 200 angstrom and a length of about 1 micron. A metal film having high reflectivity such as Al and Cr was used to form the mirror. Toward this mirror 30, the laser light 8 was irradiated through a recording medium and a disk-shaped glass substrate 100 from the rear surface of the optical disk 1, and this disk-shaped glass substrate 100 was employed to increase mechanical strength of the recording medium. At the same time, the photodetector 4 was provided on the side of the rear surface of the optical disk 1, so that a light strength of a portion within a region 81 onto which the laser light was irradiated, and limited to another region 82 located just under the mirror 30, could be increased. As a result, only a magnetic domain 21 present in the region 82 could be detected by utilizing either the Faraday effect, or the Karr effect. The reflection light amount is decreased in the region where no mirror 30 is provided. As a consequence, it could be prevented that the magnetic domain 22 was erroneously detected by controlling detection sensitivity by the optical system control circuit. Therefore, the very small magnetic domain having the diameter smaller than, or equal to 1 micrometer corresponding to the laser spot size could be read out.

FIG. 19 represents a magnetic head according to another embodiment of the present invention. In this embodiment, a writing magnetic pole 31 of the magnetic head 11 is provided on the side of the medium surface, and a mirror surface of this writing magnetic pole 31 is used as the mirror. To realize this structure of the magnetic head, a metal material such as Fe, Ni, or Ca was employed as the material of the magnetic pole 31 provided on the surface of the magnetic head 11. Since this writing magnetic pole 31 is utilized as the mirror in a utilized as the mirror in a similar manner to that of the embodiment shown in FIGS. 18A–18B, a light strength of a portion located just under this mirror and also limited to the region 83 onto which the laser light 8 is irradiated, may be strengthened, and only the magnetic domain 24 existing in this region 83 may be detected by the photodetector provided at the rear surface of the medium 1 in a similar manner to that of the previous embodiment.

The above-described magnetic domain to be read out was written by inverting the magnetizing direction of the magnetic pole 31 employed in the magnetic head 11 shown in FIG. 19 with use of an electric signal 41. During this writing operation, since there is no problem in the reading operation (namely, low detection sensitivity of the conventional magnetic disk), such a magnetic head having a narrow magnetic pole along the track direction may be employed. In this case, the magnetic pole having the width of approximately 200 angstrom and the length of about 1 micrometer was employed. At this time, the dimension of the written magnetic domain was approximately 200 angstrom.

Also, even when the lowing phenomenon of coercive force of the medium is utilized which is caused by the local temperature increase produced by reflecting the laser light 8 from the rear surface of the optical disk, while the metallic magnetic pole 31 is used as the mirror in FIG. 19, the very small magnetic domain can be written. This is the novel writing principle different from the conventional writing methods for the magneto-optical disk and the magnetic disk. That is, the locally lowering region 83 with respect to the coercive force is produced in the optical disk 1 by irradiating the laser light 8 thereto. At this time, the magnetic pole magnetizing strength is controlled and the polarity thereof is inverted in accordance with an information series, so that the magnetic domains magnetized along a specific direction can be produced only in such a portion located just under the metallic magnetic pole 31 whose coercive force has been lowered, and also limited to the region 83 onto which the laser light 8 is illuminated. In the regions whose coercive force is not lowered, even when the magnetic field produced from the magnetic pole 31 would be given thereto, if this magnetic field is below than the coercive force, then no magnetic domain is newly produced.

Referring back to FIGS. 18A–18B, a description will now be made of an example where a thermo-magnetic writable magnetic film is employed as the storage medium of the optical disk 1. As the storage medium, GdFeCo, TbFeCo, a Pt/Co multilayer film, or an alloy film was utilized. These magnetic films corresponding to the storage medium was formed on the glass substrate 100. The remaining apparatus structures may be similar to those shown in FIG. 17. The magnetic domains present in the magneto-optical film may be detected by way of the detecting means for utilizing the above-described Kerr effect, or Faraday effect, while the information is optically read out.

As to the writing operation, a new writing method could be achieved when the magneto-optical film is employed as the storage medium. As shown in FIG. 18B, the laser light 8 was incident from the rear surface of the optical disk upon the rear surface of the air-flying, head 11 toward the mirror 30 in a similar manner to that of the reading operation. It should be noted that light strength of the laser light 8 was increased several times higher than that during the reading operation. Since the laser light is reflected by the mirror 30, the temperature was increased up to approximately 200° C., thereby causing the thermomagnetic phenomenon at the portion located just under the mirror 30 and limited by the region 82 onto which the laser light was irradiated. Therefore, the magnetic domains could be written into this portion in a similar effect to that of the conventional magneto-optical disk. Since the temperature increasing region is limited to such a region onto which the laser light is incident and the laser light reflected from the mirror is irradiated, such a temperature increase can be produced within the narrow region having the size smaller than the laser spot size by making the mirror very small, or irradiating the laser light onto a very small portion of the mirror. As a result, very small magnetic domains with the size of approximately 0.1 micrometer could be written. Furthermore, the temperature in the thermomagnetic film may be locally increased even when the mirror 30 is made of AlTi, AlCu and the like to control reflectivity, and to increase the temperature of this mirror per se, and this thermal energy is transferred to the closely provided optical disk 1.

The laser light 8 shown in FIGS. 18A–18B are turned ON/OFF in response to an information stream, so that it could be judged whether or not the temperature is time sequentially changed. As a result, the information could be written in correspondence with presence of the very small magnetic domain 23 according to the principle similar to that of the conventional magneto-optical disk. However, in accordance with this writing method, the magnetizing directions of the storage medium of the optical disk must be coincident with each other before the information is written. Since turning ON/OFF of the laser light may only control to judge whether or not the magnetic domain is present, no information can be written into the optical disk where the magnetic domains were already present. To solve this problem, the old information must be erased by way of such means for heating the optical disk, or for applying a strong magnetic field to this disk. When such an erasing means cannot be employed, either a magnetic-domain erasing magnetic pole may be provided with the head, or a magnetic-domain erasing coil is located close to the optical disk, so that the old information may be erased before writing new information. When this magnetic-domain erasing coil is employed as an auxiliary magnetic pole used to the writing operation, it may be realized the writing operation by the magnetic modulation method for the magneto-optical disk. In other words, when the polarity of the auxiliary magnetic pole s inverted in response to the information stream under condition that the laser light 8 shown in FIG. 18 is under ON state, the magnetic domains are produced in response to the polarities of the auxiliary magnetic pole. In accordance with this method, the new information may be written on the old information.

Referring again to FIG. 19, a description will now be made of another novel magnetic-domain writing method for such a case that a magnetic pole is provided with the head 11. When the metallic magnetic pole 31 is used as the mirror and the laser light 8 emitted from the rear surface of the optical disk is reflected on this mirror, as previously stated, a local temperature increase may occur in the region 83 of the optical disk 1. Thus, this magnetic-domain writing method is realized by utilizing the lowering phenomenon of coercive force in the region 83, which is caused by the above-explained local temperature increase. Because coercive force is the major parameter to determine a degree of easily producing the magnetic domain, the magnetizing strength of the magnetic pole is controlled and also the polarity is inverted in accordance with the information stream, so that the magnetic domains equal to the polarities of the magnetic poles may be produced only in the portion which is located just under the metallic magnetic pole and is limited to the region 83, the coercive force of which is lowered by irradiating the laser light thereto. At this time, even when the magnetic field exerted from the magnetic pole is given to the regions whose coercive force is not lowered, if the strength of this magnetic field is lower than the coercive force, no magnetic domain is produced, so that a very small magnetic domain may be written.

In this writing method, the magnetic domains can be produced under the small magnetic field of the magnetic pole, namely under the small current, which is different from that of the conventional magnetic disk. Also, in accordance with this writing method, as the magnetic domains can be arbitrarily written along the magnetizing direction of the magnetic pole, there is such a feature that a new magnetic domain can be written into the old information in a similar manner to that of the conventional magnetic disk.

An embodiment of a parallel writing method will now b explained with reference to FIG. 20A. In this embodiment, a plurality of writing magnetic poles 30-a to 30-d are employed within a single head 11 along a direction substantially perpendicular to the relative moving direction between the optical head and the head, and electric signals may be separately inputted to the respective magnetic poles. Then, the above-described writing operation was performed in a parallel mode within the single magnetic head. Concretely speaking, under such a condition that the common laser 85 overlapped with at least one portion of all magnetic poles 30-a to 30-d which are provided in parallel to each other, the respective magnetizing directions of the magnetic poles are inverted in correspondence with an arbitrary information stream, whereby a plurality of information was converted into parallel presence of the magnetic domains to be written in the storage medium. A large number of magnetic poles could be present within a spot size of a single laser by irradiating the common laser. As a result, the information could be written in the parallel form by a single head, namely a high density information writing operation could be realized at a high speed.

Referring now to FIG. 20B, a description will be made of such an example where the parallel-written information is time-sequentially read out by way of a single detector. Either a plurality of reading mirrors 43-a to 43-d, or magnetic poles having mirror functions were positionally shifted along the relative moving direction between the optical disk and the head 11. With this arrangement, the magnetic domains 125 to 128 on the optical disk are located on the respective mirrors at different timings. The laser light 86 is irradiated from the rear surface of the optical disk onto a region containing at least a surface of the optical disk, which is overlapped with this mirror, or the magnetic pole having the mirror function. As a result, both the magnetic domain 125 existing in the portion located just under these mirrors or the magnetic poles, and limited to the region onto which the laser light is irradiated, and also the magnetic domains 126 to 128 present in other regions may be detected by a single detector at different timings. With employment of this principle idea, the information can be read/written in a parallel mode by way of a single head.

Figure 21A:
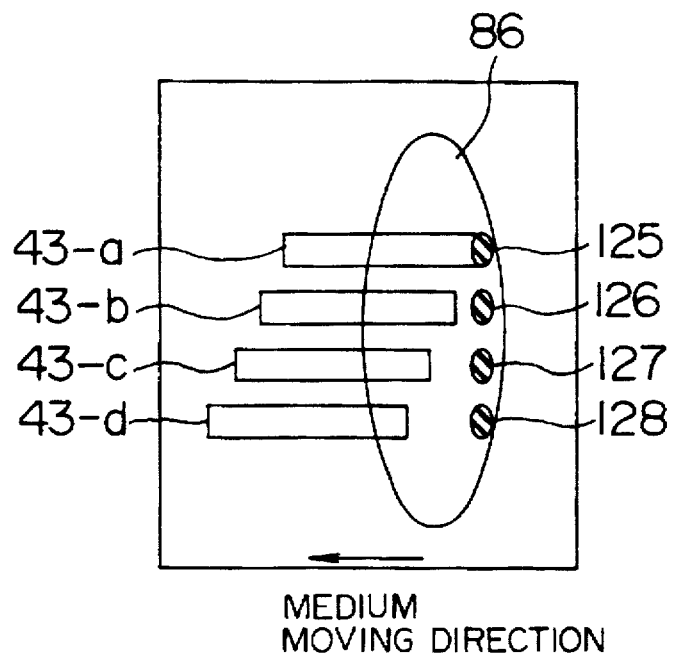
Figure 21B:
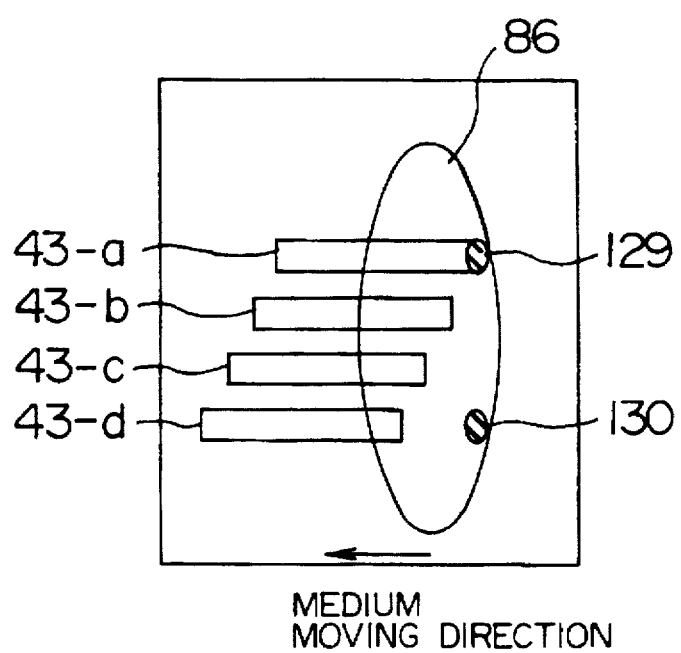
Figure 21C:

FIGS. 21A–21E represent such a situation that the laser light 86 is irradiated from the rear surface of the optical head to either the magnetic poles 43-a to 43-d having the mirror function, or a plurality of reading mirrors positionally shifted along the relative movement direction for the optical head and the magnetic head. A method for time-sequentially reading parallel information by way of a single detector will now be explained with reference to FIGS. 21A to 21B. FIG. 21A shows such a case that 4 magnetic domains 125, 126, 127, 128 are present in a parallel form. When a plurality of reading mirrors are provided with being positionally shifted along the relative moving direction, these magnetic domains reach just under the mirrors at different timings in accordance with the movement of the optical disk. As a consequence, strengths of the detection signal derived from the photodetector are varied in four stages with respect to the time axis, as illustrated by a solid line of FIG. 21C. On the other hand, as shown in FIG. 21B, where there are two magnetic domains 129 and 130, strengths of the detection signal are changed in two stages, as illustrated by a dotted line of FIG. 21C. As described above, it can be seen that the amplitude of the detection signal depends upon the total number of the existing magnetic domains.

Figure 21D:
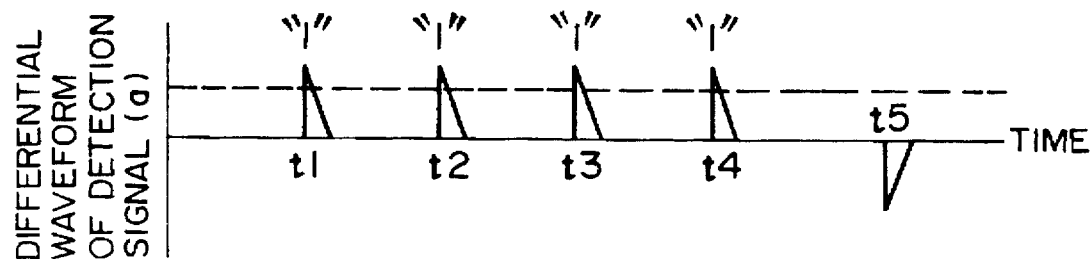
Figure 21E:
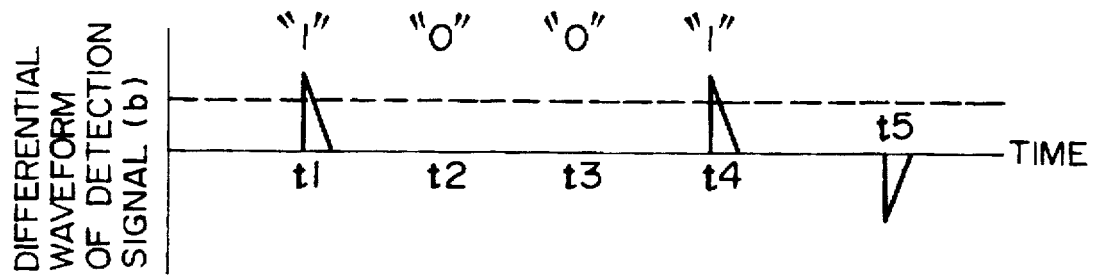

Also, since the timing at which presence of the magnetic domain is detected by the mirror 43-a, and the timings for detecting presence of the magnetic domains by other mirrors 43-d and the like are constant, the position where the respective magnetic domains are present may be calculated based upon the times when the detection signal is varied. This timing extraction may be realized by, for instance, differentiating the detection signal and by comparing the differentiated signals with each other. FIG. 21D shows a differential waveform in the above FIG. 21A, and FIG. 21E represents another differential waveform in the above FIG. 21B. From FIGS. 21D and 21E, it may be understood that signals corresponding to presence of the magnetic domains are obtained at different times t1, t2, t3 and t4. The spatially parallel-existing information (presence of magnetic domain) can be read out by being converted into electric signals separated from each other with respect to the time axis by comparing the amplitudes of these signals, indicated by the dotted line, with each other in a comparator. As a consequence, a plurality of information can be realized by a single head at a high speed.

The separation of the parallel information obtained by the step-wise changes in the signal strengths may also be realized by additionally performing such a process to A/D-convert the detection signal and then process the A/D-converted signal in a digital circuit. The above-explained function capable of inputting/outputting a plurality of information streams with very small time periods by way of a signal head, cannot be realized in the conventional magneto-optical disk as well as the conventional magnetic disk.

It should be noted that since the parallel-existing magnetic domains 125 to 128 are arranged in the direction normal to the relative moving direction of the optical head with respect to the head 11 in the previous embodiment shown in FIG. 21, the reading mirrors 43-a to 43-d are positionally shifted along the relative moving direction so as to separate these magnetic domains on the time axis to read out them. Alternatively, when, for instance, a plurality of timings inputted to a plurality of writing magnetic poles are slightly shifted, and the parallel magnetic domains are formed not normal to the above-explained relative moving direction, but slightly incident thereto, even if the reading mirrors 43-a to 43-d are not positionally shifted from each other, the parallel information may be read while being separated on the time axis.

Further, to realize the above-described parallel information input/output, a pattern having the mirror function of the head unit 11 may be made as illustrated in FIG. 22. That is, either the reading mirrors, or the magnetic poles 43-a to 43-d having the mirror function, and either the reading magnetic poles, or the writing mirrors 30a to 30-d are positioned apart from each other by the substantially equal radial distance with respect to the rotation center of the medium. As a consequence, the information can be read/written by employing a single head and a single laser beam, and the addressing mechanism can be commonly utilized for the reading/writing operations, resulting in a simple addressing mechanism. Since the written magnetic domains 27 are overlapped with the reading portion and the portion onto which the laser light 87 is irradiated at which precision within a range where there are no medium and thermal disturbance of the head, the addressing control of the information ca be readily achieved.

To read and write a very small magnetic domain, either mirrors provided on the head 11, or magnetic poles 44a to 44-d having the functions of the mirrors are shown as a structure of FIGS. 23A–23B. FIG. 23A is a sectional view for showing the input/output head as viewed in a direction along which the head is moved with respect to the optical, and FIG. 23B is a sectional view, as viewed vertically. The pattern having the mirror function was patterned after metal films made of Fe, or Ni have been laminated in such a manner that with a thickness of 200 angstrom, a high polymer resin such as silicon oxide and a polyimid resin having a thickness of 200 angstrom had been formed as a spacer, and then the required photolithography process was carried out. After the pattern has been fabricated, coil patterns 56, 57, 58, 59 used to produce magnetic fields were formed. At this time, such a heed structure was made that the magnetic pole 44-a corresponds to the coil pattern 56, the magnetic pole 44-b corresponds to the coil pattern 57, the magnetic pole 44-c corresponds to the coil pattern 58, and the magnetic pole 44-d corresponds to the coil pattern 59. After the head has been manufactured in such a step, a section thereof was a surface positioned close to the optical disk. The relative moving direction between the head and the optical head was selected to be the longitudinal direction of the pattern which was obtained from the required photolithography process after the metal films had been laminated.

As previously stated, as either the mirrors provided on the head 11, or the magnetic poles 44-a to 44-d having the mirror functions, the section of the metal films formed by being laminated on the plane substrate is employed, so that the widths of the magnetic poles could be made as the thickness of the laminated films. In this case, the laminated thickness may be controlled within a wide range from several angstrom to several micrometers, and there is no problem in reproducibility. Conventionally, there is such a problem that the width of the magnetic pole is restricted by resolution of light used during the photolithography process. To the contrary, according to this method, this restriction can be solved. Therefore, the magnetic domain having the size of on the order of angstrom can be written unless problems are present on the storage medium. We could confirm that the magnetic domain having the size smaller than, or equal to approximately 0.1 micrometer could be written in the experience.

In the above-explained embodiments, the magnetic film for magnetically recording the information, or the magnetic-optical film such as the thermomagnetic recording material are employed as the storage medium of the optical disk. The present invention is not limited to these materials, but may be applied to, as the storage medium, either a phase change material such as a chalcogenid glass, or a photochromic material. That is, even when these storage materials are employed as the storage medium of the optical disk, a change may be produced in a region having a size smaller than, or equal to the spot size of the laser beam by commonly utilizing the very small mirrors, whereby the information could be written at high density. The information written in this manner may be read by employing the photodiodes to detect a variation in the reflectivities of the storage medium, which are caused by, for instance, differences in the phase conditions and the coloring conditions. Also, the information may be magnetically, or optically written into the optical disk, otherwise, may be magnetically and optically written therein.

According to this embodiment, the effective spot diameter of the laser beam can be made small. As a consequence, the storage capacity of the optical disk can be increased by approximately $10^2$, as compared with that of the conventional optical disk. Moreover, the mirror functions are merely added to the magnetic disk head, so that such an optical disk high-density storage apparatus can be realized with the substantially same conventional structure.

What is claimed is:

1. An optical disk high-density storage apparatus including a means for reading and writing information, comprising:

an air-flying head equipped with a very small mirror facing to an optical disk, and capable of flying on a first surface of the optical disk; and an optical system including a laser light irradiating means and a photodetecting means, whereby the laser light is irradiated from a second surface of said optical disk to a region containing at least a region of said optical disk overlapped with said very small mirror thereby reading the information stored in said optical disk.

2. An optical disk high-density storage apparatus as claimed in claim 1, wherein said air-flying head owns an information writing magnetic pole; and wherein said very small mirror is a mirror of said magnetic pole.

3. An optical disk high-density storage apparatus as claimed in claim 1, wherein said head owns an information writing magnetic pole; and wherein said magnetic domain is written by inverting a polarity of said information writing magnetic pole.

4. An optical disk high-density storage apparatus as claimed in claim 1, wherein information is written into a region containing at least a region of the optical disk overlapped with said very small mirror, while the laser light is irradiated onto said region from the second surface of said optical disk.

5. An optical disk high-density storage apparatus as claimed in claim 1, wherein said head has an information writing magnetic pole; and wherein said magnetic domain is written into a region of said optical disk onto which the laser light is irradiated to increase a temperature of said region, and which is located just under said magnetic pole due to the thermomagnetic phenomenon.

6. An optical disk high-density storage apparatus as claimed in claim 1, wherein said head owns an information writing magnetic pole; and wherein said magnetic pole is used as a mirror for reflecting the laser light from the rear surface of said optical head, and also a magnetizing polarity of said magnetic pole is inverted in response to an information stream, whereby a magnetic domain corresponding to information of "1" and "0" is written into a region of said optical disk which is located just under said magnetic pole and onto which the laser light is irradiated.

7. An optical disk high-density storage apparatus as claimed in claim 1, wherein a plurality of information writing magnetic poles are arranged within a single head along a direction substantially normal to a relative moving direction between said optical disk and said head; and wherein a plurality of information is written by inverting magnetizing polarities of said plural magnetic poles in correspondence with an arbitrary information stream, while said plural information is converted into parallel presence of the magnetic poles.

8. An optical disk high-density storage apparatus as claimed in claim 1, wherein a plurality of information writing magnetic poles are arranged within a single head along a direction substantially normal to a relative moving direction between said optical disk and said head; and wherein under such a condition that common laser light which is partially overlapped with all of said plural magnetic poles, is irradiated from the second surface of the optical disk onto the optical disk, a plurality of information is written by inverting magnetizing polarities of said plural magnetic poles in correspondence with an arbitrary information stream, while said plural information is converted into parallel presence of the magnetic poles.

9. An optical disk high-density storage apparatus as claimed in claim 1, wherein a plurality of said very small mirrors are positionally shifted along the relative moving direction between said optical disk and said head; and wherein a plurality of information which has been written into a region located just under said plurality of very small mirrors and onto which the laser light is irradiated, is detected by the photodetecting means, while common laser light which is partially overlapped with at least all of said plurality of very small mirrors, is irradiated from the rear surface to the optical disk.

10. An optical disk high-density storage apparatus as claimed in claim 1, wherein a plurality of information is separated from each other and detected based on both of an output from said photodetecting means and change timings of said output.

11. An optical disk high-density storage apparatus as claimed in claim 1, wherein said head is equipped with a reading very small mirror and either a writing magnetic pole, or a writing very small mirror; and wherein said reading very small mirror and either said writing magnetic pole, or said writing very small mirror are positioned apart from each other by an equal radial distance with respect to a rotation center of said optical disk.

12. An optical disk high-density storage apparatus as claimed in claim 11, wherein either said very small mirror, or said magnetic pole having the function of said very small mirror is constructed by a sectional plane of a metal film laminated on a plane substrate.

13. An optical disk high-density storage apparatus including a means for reading and writing information, comprising:

an air-flying head equipped with a very small mirror facing to an optical disk, and capable of flying on a surface of the optical disk; and an optical system including a laser light irradiating means and a photodetecting means, whereby the laser light is irradiated from a rear surface of said optical disk to a region containing at least a region of said optical disk overlapped with said very small mirror, thereby reading the information stored in said optical disk, wherein a width of said very small mirror is smaller than a spot diameter of said laser light irradiated onto said optical disk.

14. An optical disk high-density storage apparatus as claimed in claim 13, wherein a magnetic domain which is located just under said very small mirror and is present in a portion limited to the region onto which the laser light is irradiated, is detect by said photodetecting means arranged at a rear side of the optical disk by utilizing either the Faraday effect, or the Kerr effect.

15. Apparatus comprising:

a motor rotating an optical disk;

a head for irradiating an energy beam to the optical disk from a side of a first surface of the optical disk; and a mirror arranged on a side of a second surface of the optical disk;

wherein the energy beam is passed through the optical disk and a part of the energy beam passed through the optical disk is reflected by a surface of the mirror to be irradiated to the optical disk.

16. Apparatus comprising:

a motor rotating an optical disk;

a head for irradiating an energy beam to the optical disk; and an energy beam reflecting mirror arranged so as to oppose a surface of the optical disk;

wherein the energy beam is irradiated to a part of a predetermined area of the optical disk such that the energy beam is only overlapped with a reflected energy beam reflected by the energy beam reflecting mirror at the part of the predetermined area when the energy beam is irradiated to the predetermined area of the optical disk.

17. Apparatus comprising:

a motor rotating an optical disk;

a head irradiating a light beam toward the optical disk in a first direction to form an optical spot on the optical disk; and a reflection mirror arranged in parallel to a surface of the optical disk;

wherein a part of the energy beam is reflected by the reflection mirror to be irradiated toward the optical disk in a second direction opposite to the first direction.

* * * * *